United States Patent
Huang et al.

(10) Patent No.: US 12,278,613 B1
(45) Date of Patent: Apr. 15, 2025

(54) SURFACE ACOUSTIC WAVE RESONATOR DEVICE, MANUFACTURING METHOD THEREFORE AND FILTER

(71) Applicant: Shenzhen Newsonic Technologies Co., Ltd., Guangdong (CN)

(72) Inventors: Lei Huang, Guangdong (CN); Jie Zou, Guangdong (CN); Gongbin Tang, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/916,122

(22) Filed: Oct. 15, 2024

(30) Foreign Application Priority Data

Dec. 13, 2023 (CN) .......................... 202311703567.0

(51) Int. Cl.
| | |
|---|---|
| H03H 9/02 | (2006.01) |
| H03H 3/08 | (2006.01) |
| H03H 9/145 | (2006.01) |
| H03H 9/25 | (2006.01) |

(52) U.S. Cl.
CPC .......... *H03H 9/02818* (2013.01); *H03H 3/08* (2013.01); *H03H 9/02637* (2013.01); *H03H 9/02834* (2013.01); *H03H 9/02944* (2013.01); *H03H 9/02992* (2013.01); *H03H 9/145* (2013.01); *H03H 9/25* (2013.01)

(58) Field of Classification Search
CPC ........... H03H 9/02818; H03H 9/02637; H03H 9/02992; H03H 9/145; H03H 9/25
USPC ...... 310/313 R, 313 A, 313 B, 313 C, 313 D
See application file for complete search history.

(56) References Cited

U.S. PATENT DOCUMENTS

2013/0051588 A1*  2/2013  Ruile ................... H03H 9/1457
                                                        29/25.35

FOREIGN PATENT DOCUMENTS

CN          116979926 A      10/2023

\* cited by examiner

*Primary Examiner* — Derek J Rosenau
(74) *Attorney, Agent, or Firm* — LEASON ELLIS LLP

(57) ABSTRACT

A surface acoustic wave resonator device, manufacturing method therefor and filter, the surface acoustic wave resonator device includes: an interdigital transducer, located on a piezoelectric substrate and including first and second interdigital electrode lead-out parts, and first and second interdigital electrodes extending along a first direction and alternately arranged along a second direction, the first interdigital electrode is connected to the first interdigital electrode lead-out part, and the second interdigital electrode is connected to the second interdigital electrode lead-out part; and a clutter suppression structure, including a body structure and a sawtooth structure, wherein the body structure continuously extends along the second direction and overlaps with the interdigital electrodes in a third direction, and the sawtooth structure is disposed at a side of the body structure in the first direction, and at least a portion of the sawtooth structure overlaps with the interdigital electrodes in the third direction.

20 Claims, 9 Drawing Sheets

SURFACE ACOUSTIC WAVE RESONATOR DEVICE, MANUFACTURING METHOD THEREFORE AND FILTER

CROSS-REFERENCE TO RELATED APPLICATION(S)

The application claims priority to the Chinese patent application No. 202311703567.0, filed on Dec. 13, 2023, the entire disclosure of which is incorporated herein by reference as part of the present application.

TECHNICAL FIELD

Embodiments of the present disclosure relate to the field of resonators and filters, and in particular relate to a surface acoustic wave resonator device, a manufacturing method therefor and a filter.

BACKGROUND

With the rapid development of mobile communication technologies, filters based on resonators are more and more widely and extensively applied in communication devices such as smart phones. As a kind of acoustic wave filter, surface acoustic wave (SAW) filter has the advantages of small volume and light weight, etc., and is widely used in current communication devices. Clutters in spurious modes are present in traditional surface acoustic wave resonators/filters, which will affect the performance of the resonators/filters. How to improve the clutter suppression capability of the resonator device is an important research topic in this field.

SUMMARY

At least one embodiment of the present disclosure provides a surface acoustic wave resonator device having a body region and a peripheral region, wherein the peripheral region includes a first peripheral region and a second peripheral region located at two opposite sides of the body region in a first direction, and the surface acoustic wave resonator device includes: a piezoelectric substrate; an interdigital transducer, disposed on a side of the piezoelectric substrate and including a plurality of interdigital electrodes, a first interdigital electrode lead-out part and a second interdigital electrode lead-out part, wherein the plurality of interdigital electrodes include a first interdigital electrode and a second interdigital electrode; the first interdigital electrode and the second interdigital electrode extend along the first direction and are alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and a clutter suppression structure, disposed on a side of the interdigital transducer away from the piezoelectric substrate and including a body structure and a sawtooth structure, wherein the body structure continuously extends along the second direction and overlaps with end portions of the plurality of interdigital electrodes close to the peripheral region in a third direction perpendicular to a main surface of the piezoelectric substrate, and the sawtooth structure is disposed at a side of the body structure away from the body region in the first direction, and at least a portion of the sawtooth structure overlaps with the plurality of interdigital electrodes in the third direction.

In the surface acoustic wave resonator device provided by at least one embodiment of the present disclosure, the first interdigital electrode has a first electrode edge that is away from the first interdigital electrode lead-out part in the first direction; the second interdigital electrode has a second electrode edge that is away from the second interdigital electrode lead-out part in the first direction; wherein the sawtooth structure extends beyond at least one of the first electrode edge and the second electrode edge in the first direction, and at least a portion of the sawtooth structure is located in the peripheral region; or the sawtooth structure has a sidewall aligned with the first electrode edge or the second electrode edge in the third direction.

In the surface acoustic wave resonator device provided by at least one embodiment of the present disclosure, the clutter suppression structure includes: a first clutter suppression substructure, including a first body part and a first sawtooth part which are connected with each other, wherein the first body part overlaps with the end portions of the plurality of interdigital electrodes close to the first peripheral region in the third direction, and the first sawtooth part protrudes, in the first direction, from a first body sidewall of the first body part close to the first peripheral region; and a second clutter suppression substructure, including a second body part and a second sawtooth part which are connected with each other, wherein the second body part overlaps with the end portions of the plurality of interdigital electrodes close to the second peripheral region in the third direction, and the second sawtooth part protrudes, in the first direction, from a second body sidewall of the second body part close to the second peripheral region, wherein the first body part and the second body part constitute the body structure, and the first sawtooth part and the second sawtooth part constitute the sawtooth structure.

In the surface acoustic wave resonator device provided by at least one embodiment of the present disclosure, at least a portion of the first sawtooth part overlaps with the first interdigital electrode in the third direction; and at least a portion of the second sawtooth part overlaps with the second interdigital electrode in the third direction.

In the surface acoustic wave resonator device provided by at least one embodiment of the present disclosure, the sawtooth structure further includes at least one of following features: the first sawtooth part further includes a portion overlapping with the second interdigital electrode in the third direction; and the second sawtooth part further includes a portion overlapping with the first interdigital electrode in the third direction.

In the surface acoustic wave resonator device provided by at least one embodiment of the present disclosure, the first sawtooth part includes a plurality of first extension parts extending along the first direction and arranged at intervals along the second direction; and the second sawtooth part includes a plurality of second extension parts extending along the first direction and arranged at intervals along the second direction.

In the surface acoustic wave resonator device provided by at least one embodiment of the present disclosure, a spacing between adjacent first extension parts among the plurality of first extension parts in the second direction or a spacing between adjacent second extension parts among the plurality of second extension parts in the second direction is greater than or equal to a spacing between adjacent interdigital electrodes among the plurality of interdigital electrodes in the second direction.

In the surface acoustic wave resonator device provided by at least one embodiment of the present disclosure, the plurality of first extension parts at least include a first sub-extension part, wherein the first sub-extension part and the first interdigital electrode are disposed in one-to-one correspondence with each other and overlap with each other in the third direction; the plurality of second extension parts at least include a second sub-extension part, wherein the second sub-extension part and the second interdigital electrode are disposed in one-to-one correspondence with each other and overlap with each other in the third direction.

In the surface acoustic wave resonator device provided by at least one embodiment of the present disclosure, an orthographic projection of the first sub-extension part on the piezoelectric substrate is located within a range of an orthographic projection of the first interdigital electrode on the piezoelectric substrate; and an orthographic projection of the second sub-extension part on the piezoelectric substrate is located within a range of an orthographic projection of the second interdigital electrode on the piezoelectric substrate.

In the surface acoustic wave resonator device provided by at least one embodiment of the present disclosure, a width of the first sub-extension part in the second direction is less than or equal to a width of the first interdigital electrode in the second direction; and a width of the second sub-extension part in the second direction is less than or equal to a width of the second interdigital electrode in the second direction.

In the surface acoustic wave resonator device provided by at least one embodiment of the present disclosure, the plurality of first extension parts further include a first additional sub-extension part, and an orthographic projection of the first additional sub-extension part on the piezoelectric substrate is at least partially aligned, in the first direction, with an orthographic projection of the second interdigital electrode on the piezoelectric substrate; and the plurality of second extension parts further include a second additional sub-extension part, and an orthographic projection of the second additional sub-extension part on the piezoelectric substrate is at least partially aligned, in the first direction, with an orthographic projection of the first interdigital electrode on the piezoelectric substrate.

In the surface acoustic wave resonator device provided by at least one embodiment of the present disclosure, the orthographic projection of the first additional sub-extension part borders, or is offset from or partially overlapped with the orthographic projection of the second interdigital electrode, or the orthographic projection of the first additional sub-extension part is located within a range of the orthographic projection of the second interdigital electrode; the orthographic projection of the second additional sub-extension part borders, or is offset from or partially overlapped with the orthographic projection of the first interdigital electrode, or the orthographic projection of the second additional sub-extension part is located within a range of the orthographic projection of the first interdigital electrode.

In the surface acoustic wave resonator device provided by at least one embodiment of the present disclosure, an orthographic projection of the first body sidewall on the piezoelectric substrate and an orthographic projection of the second electrode edge of the second interdigital electrode away from the second interdigital electrode lead-out part on the piezoelectric substrate are aligned with each other in the second direction, or the first body sidewall is offset in the first direction, towards or away from the first peripheral region, with relative to the second electrode edge; and an orthographic projection of the second body sidewall on the piezoelectric substrate and an orthographic projection of the first electrode edge of the first interdigital electrode away from the first interdigital electrode lead-out part on the piezoelectric substrate are aligned with each other in the second direction, or the second body sidewall is offset in the first direction, towards or away from the second peripheral region, with relative to the first electrode edge.

In the surface acoustic wave resonator device provided by at least one embodiment of the present disclosure, a portion of the first body sidewall is aligned, in the third direction, with a second electrode edge of the second interdigital electrode away from the second interdigital electrode lead-out part; a portion of the second body sidewall is aligned, in the third direction, with the first electrode edge of the first interdigital electrode away from the first interdigital electrode lead-out part.

In the surface acoustic wave resonator device provided by at least one embodiment of the present disclosure, the first clutter suppression substructure and the second clutter suppression substructure each have a first side and a second side opposite to each other in the first direction, wherein the first side is provided with the sawtooth structure and has an uneven surface, and the second side is away from the peripheral region and has a flat surface extending continuously in the second direction.

In the surface acoustic wave resonator device provided by at least one embodiment of the present disclosure, the first peripheral region has a first peripheral width, which is defined by a distance between the first interdigital electrode lead-out part and a second electrode edge of the second interdigital electrode away from the second interdigital electrode lead-out part in the first direction; and a distance between the first body sidewall and the first interdigital electrode lead-out part in the first direction is equal to the first peripheral width; the second peripheral region has a second peripheral width, which is defined by a distance between the second interdigital electrode lead-out part and a first electrode edge of the first interdigital electrode away from the first interdigital electrode lead-out part in the first direction; and a distance between the second body sidewall and the second interdigital electrode lead-out part in the first direction is equal to the second peripheral width.

In the surface acoustic wave resonator device provided by at least one embodiment of the present disclosure, a width of the first sawtooth part in the first direction is less than or equal to 20% of the first peripheral width; and a width of the second sawtooth part in the first direction is less than or equal to 20% of the second peripheral width.

In the surface acoustic wave resonator device provided by at least one embodiment of the present disclosure, the first interdigital electrode and the second interdigital electrode each include a central part, a first end part, a second end part and a connecting part; in each interdigital electrode, the first end part and the second end part are located at two opposite sides of the central part in the first direction, and the connecting part is located at a side of the second end part away from the central part and is connected to a corresponding one of the first interdigital electrode lead-out part and the second interdigital electrode lead-out part; the connecting part of the first interdigital electrode is located in the first peripheral region, and the connecting part of the second interdigital electrode is located in the second peripheral region; and orthographic projections of the first end part and the second end part of the first interdigital electrode and the first end part and the second end part of the second interdigital electrode on the piezoelectric substrate are located within a range of an orthographic projection of the clutter suppression structure on the piezoelectric substrate.

In the surface acoustic wave resonator device provided by at least one embodiment of the present disclosure, orthographic projections of a portion of the connecting part of the first interdigital electrode and a portion of the connecting part of the second interdigital electrode on the piezoelectric substrate are also located within the range of the orthographic projection of the clutter suppression structure on the piezoelectric substrate.

In the surface acoustic wave resonator device provided by at least one embodiment of the present disclosure, orthographic projections of the second end part of the first interdigital electrode and the first end part of the second interdigital electrode on the piezoelectric substrate are located within an orthographic projection of the first body part on the piezoelectric substrate, and a portion of the connecting part of the first interdigital electrode overlaps with the first sawtooth part in the third direction; and orthographic projections of the first end part of the first interdigital electrode and the second end part of the second interdigital electrode on the piezoelectric substrate are located within an orthographic projection of the second body part on the piezoelectric substrate, and a portion of the connecting part of the second interdigital electrode overlaps with the second sawtooth part in the third direction.

In the surface acoustic wave resonator device provided by at least one embodiment of the present disclosure, in the third direction, the second end part of the first interdigital electrode and the first end part of the second interdigital electrode overlap with the first body part and overlap with the first sawtooth part; or the first end part of the first interdigital electrode and the second end part of the second interdigital electrode overlap with the second body part and overlap with the second sawtooth part.

In the surface acoustic wave resonator device provided by at least one embodiment of the present disclosure, in the third direction, a portion of the connecting part of the first interdigital electrode overlaps with the first sawtooth part and overlaps with the first body part; or a portion of the connecting part of the second interdigital electrode overlaps with the second sawtooth part and overlaps with the second body part.

In the surface acoustic wave resonator device provided by at least one embodiment of the present disclosure, the end portions of the first interdigital electrode and the second interdigital electrode overlap with the body structure and the sawtooth structure of the clutter suppression structure in the third direction; and orthographic projections of the connecting part of the first interdigital electrode and the connecting part of the second interdigital electrode on the piezoelectric substrate are offset from an orthographic projection of the clutter suppression structure on the piezoelectric substrate.

In the surface acoustic wave resonator device provided by at least one embodiment of the present disclosure, further including: reflecting gratings, disposed on two opposite sides of the interdigital transducer in the second direction, wherein each reflecting grating includes a plurality of reflective electrodes and a busbar; the plurality of reflective electrodes extend along the first direction and are arranged at intervals along the second direction; and the busbar extends along the second direction and is connected to the plurality of reflective electrodes, wherein the clutter suppression structure further partially overlaps with the reflecting gratings in the third direction perpendicular to the main surface of the piezoelectric substrate.

In the surface acoustic wave resonator device provided by at least one embodiment of the present disclosure, the first clutter suppression substructure and the second clutter suppression substructure each have an additional region overlapping with the reflecting gratings; and in the additional region, each extension part included in the first sawtooth part or the second sawtooth part overlaps with a corresponding one of the plurality of reflective electrodes in the third direction.

In the surface acoustic wave resonator device provided by at least one embodiment of the present disclosure, an orthographic projection of the each extension part on the piezoelectric substrate is located within an orthographic projection of the corresponding one of the plurality of reflective electrodes on the piezoelectric substrate.

In the surface acoustic wave resonator device provided by at least one embodiment of the present disclosure, further including: a temperature compensation layer, disposed on the piezoelectric substrate and covering the interdigital transducer, wherein the clutter suppression structure is located on a side of the temperature compensation layer away from the piezoelectric substrate.

In the surface acoustic wave resonator device provided by at least one embodiment of the present disclosure, the clutter suppression structure includes a metal structure.

In the surface acoustic wave resonator device provided by at least one embodiment of the present disclosure, the metal structure is electrically floating.

At least one embodiment of the present disclosure provides a filter, including any one of the above-described the surface acoustic wave resonator devices.

At least one embodiment of the present disclosure provides a manufacturing method for a surface acoustic wave resonator device, wherein the surface acoustic wave resonator device has a body region and a peripheral region, the peripheral region includes a first peripheral region and a second peripheral region located at two opposite sides of the body region in a first direction, the manufacturing method includes: providing a piezoelectric substrate; forming an interdigital transducer on a side of the piezoelectric substrate, wherein the interdigital transducer includes a plurality of interdigital electrodes, a first interdigital electrode lead-out part and a second interdigital electrode lead-out part, and the plurality of interdigital electrodes include a first interdigital electrode and a second interdigital electrode; the first interdigital electrode and the second interdigital electrode extend along the first direction and are alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and forming a clutter suppression structure on a side of the interdigital transducer away from the piezoelectric substrate, wherein the clutter suppression structure includes a body structure and a sawtooth structure, wherein the body structure continuously extends along the second direction and overlaps with end portions of the plurality of interdigital electrodes close to the peripheral region in a third direction perpendicular to a main surface of the piezoelectric substrate; the sawtooth structure is disposed on a side of the body structure away from the body region in the first direction, and at least a portion of the sawtooth structure overlaps with the plurality of interdigital electrodes in the third direction.

In the manufacturing method for the surface acoustic wave resonator device provided by at least one embodiment of the present disclosure, further including: before forming the clutter suppression structure, forming a temperature compensation layer on a side of the interdigital transducer away from the piezoelectric substrate, wherein the clutter suppression structure is formed on a side of the temperature compensation layer away from the piezoelectric substrate.

BRIEF DESCRIPTION OF THE DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

DETAILED DESCRIPTION

Figure 1A:
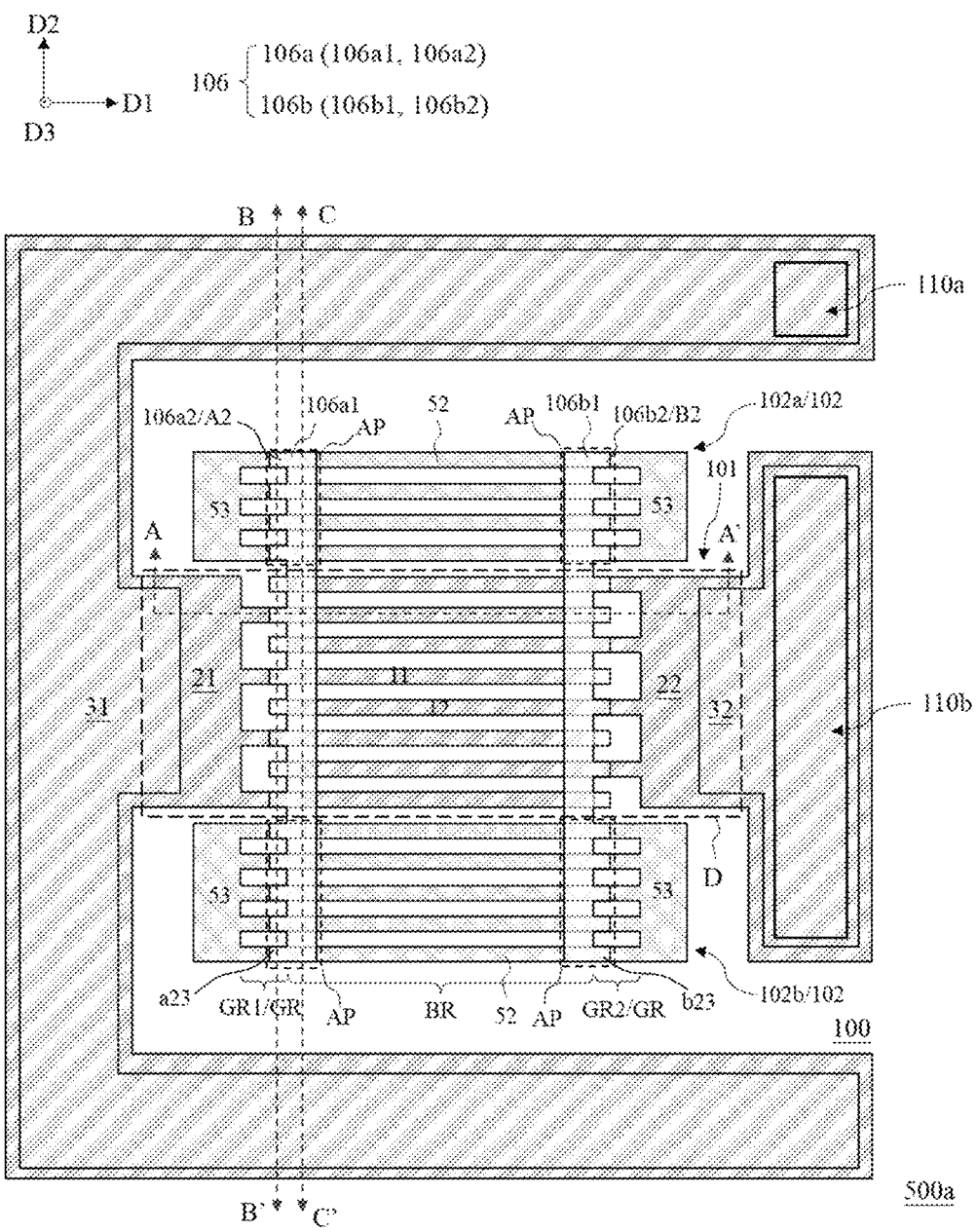
FIG. 1A illustrates a schematic top view of a surface acoustic wave resonator device according to some embodiments of the present disclosure.

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

At least one embodiment of the present disclosure provides a surface acoustic wave resonator device and a manufacturing method therefor, and a filter, the surface acoustic wave resonator device has a body region and a peripheral region, wherein the peripheral region includes a first peripheral region and a second peripheral region located at two opposite sides of the body region in a first direction, and the surface acoustic wave resonator device includes: a piezoelectric substrate; an interdigital transducer, disposed on a side of the piezoelectric substrate and including a plurality of interdigital electrodes, a first interdigital electrode lead-out part and a second interdigital electrode lead-out part, wherein the plurality of interdigital electrodes include a first interdigital electrode and a second interdigital electrode; the first interdigital electrode and the second interdigital electrode extend along the first direction and are alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and a clutter suppression structure, disposed on a side of the interdigital transducer away from the piezoelectric substrate and including a body structure and a sawtooth structure, wherein the body structure continuously extends along the second direction and overlaps with end portions of the plurality of interdigital electrodes close to the peripheral region in a third direction perpendicular to a main surface of the piezoelectric substrate, and the sawtooth structure is disposed at a side of the body structure away from the body region in the first direction, and at least a portion of the sawtooth structure overlaps with the plurality of interdigital electrodes in the third direction.

The surface acoustic wave resonator device, the manufacturing method therefor and the filter of the embodiments of the present disclosure can achieve the following technical effects: the clutter suppression structure includes a body structure and a sawtooth structure, so that an overlapping area of the clutter suppression structure and the interdigital electrode can be increased by further disposing the sawtooth structure on the basis of the body structure, thereby improving the clutter suppression capability of the clutter suppression structure, and hence reducing or eliminating the clutter in the resonator device and the filter, and improving the device performance. Moreover, the sawtooth structure is disposed at a side of the body structure away from the body region, which can prevent the sawtooth structure from occupying an area (that is, an effective resonance area) where the central part of the interdigital electrode is located, to a certain extent, therefore, it's beneficial to reducing the size of the resonator device, and hence reducing the size of the final product such as filter.

In addition, through disposing the clutter suppression structure to include both the body structure and the sawtooth structure, on the one hand, the structural stability of the clutter suppression structure can be ensured, and on the other hand, the overall area of the clutter suppression structure can be relatively reduced while increasing the overlapping area of the clutter suppression structure and the interdigital electrode, which is beneficial to reducing ohmic loss while improving the clutter suppression capability of the resonator device, thereby improving the device performance.

Figure 1B:
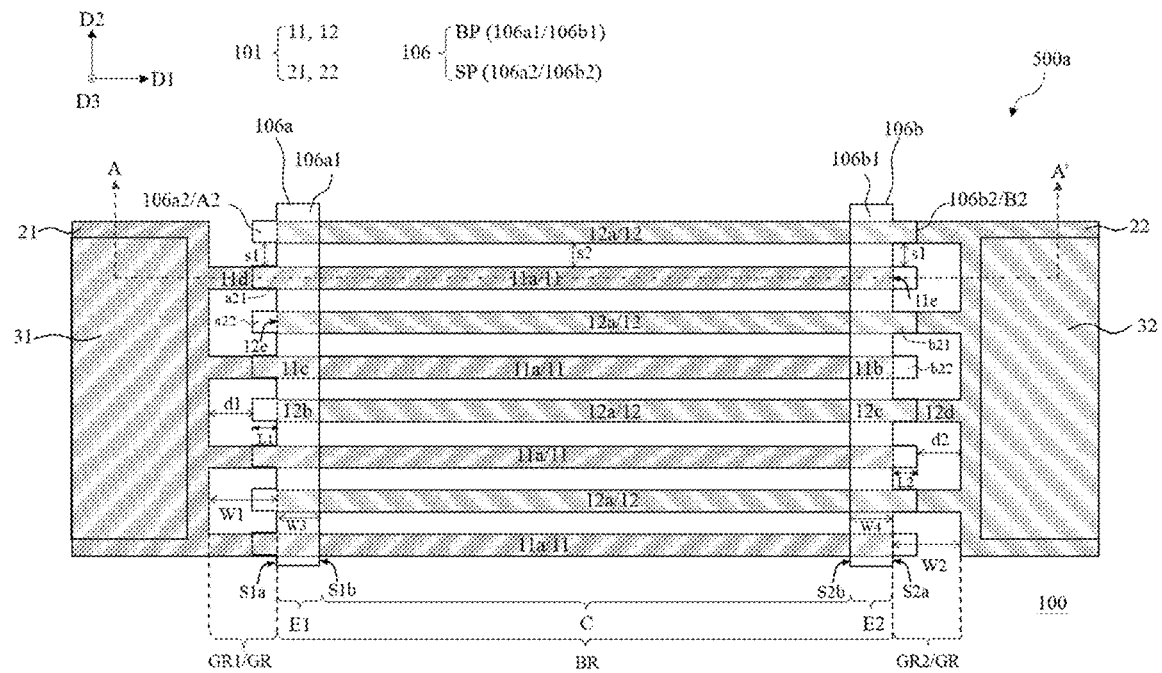
FIG. 1B illustrates a schematic enlarged top view of a partial region of the surface acoustic wave resonator device shown in FIG. 1A according to some embodiments of the present disclosure.
Figure 2A:
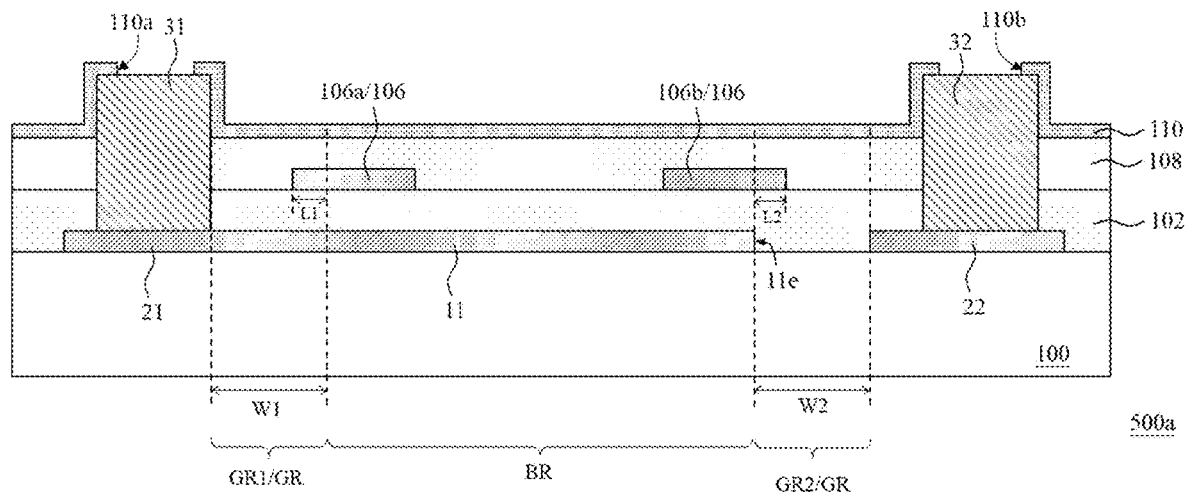
FIG. 2A illustrates a schematic cross-sectional view of the surface acoustic wave resonator device taken along line A-A' of FIG. 1A according to some embodiments of the present disclosure.
Figure 2B:
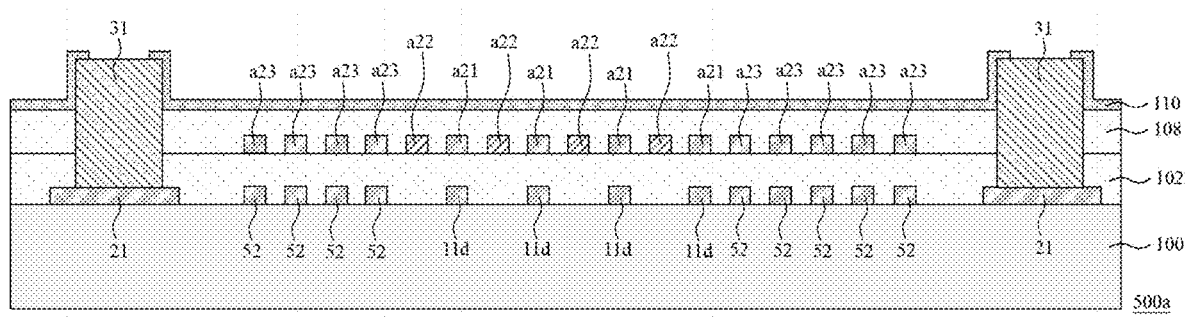
FIG. 2B illustrates a schematic cross-sectional view of the surface acoustic wave resonator device taken along line B-B' of FIG. 1A according to some embodiments of the present disclosure.
Figure 2C:
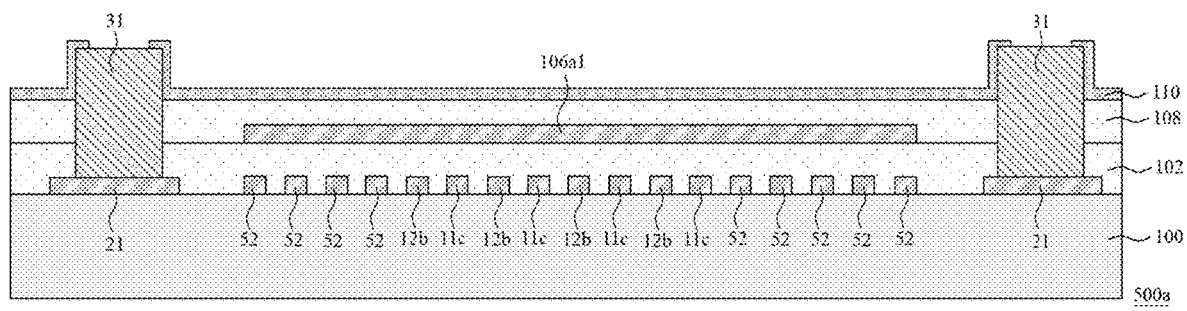
FIG. 2C illustrates a schematic cross-sectional view of the surface acoustic wave resonator device taken along line C-C' of FIG. 1A according to some embodiments of the present disclosure.

FIG. 1A illustrates a schematic top view of a surface acoustic wave resonator device according to some embodiments of the present disclosure. FIG. 1B illustrates a schematic enlarged top view of a region D of the surface acoustic wave resonator device of FIG. 1A according to some embodiments of the present disclosure. FIG. 2A, FIG. 2B and FIG. 2C illustrate schematic cross-sectional views taken along line A-A', line B-B' and line C-C' of FIG. 1A, respectively.

Referring to FIG. 1A and FIG. 1B, in some embodiments, a surface acoustic wave resonator (IDT) device 500a includes a piezoelectric substrate 100, an interdigital transducer (IDT) 101 and a clutter suppression structure 106. The interdigital transducer 101 is disposed on a side of the piezoelectric substrate 100, and the clutter suppression structure 106 is disposed on a side of the interdigital transducer 101 away from the piezoelectric substrate 100. The surface acoustic wave resonator device 500a has a body region BR and a peripheral region GR, and the peripheral region GR includes a first peripheral region GR1 and a second peripheral region GR2 located at two opposite sides of the body region BR in a first direction D1. For clarity of illustration, the clutter suppression structure 106 is shown as transparent in the top view, but it should be understood that this does not mean that the clutter suppression structure 106 is made of a transparent material. In some embodiments, the clutter suppression structure 106 includes a conductive structure, for example, a metal structure, and the metal structure may be electrically floating.

For example, the interdigital transducer 101 includes a plurality of interdigital electrodes, a first interdigital electrode lead-out part 12 and a second interdigital electrode lead-out part 22. The plurality of interdigital electrodes may include a first interdigital electrode 11 and a second interdigital electrode 12. The first interdigital electrode 11 and the first interdigital electrode lead-out part 12 are connected with each other and can jointly constitute a first interdigital electrode structure. The second interdigital electrode 12 and the second interdigital electrode lead-out part 22 are connected with each other and can jointly constitute a second interdigital electrode structure. In some embodiments, the interdigital electrode lead-out part can also be referred to as a busbar.

In some embodiments, a plurality of first interdigital electrodes 11 and a plurality of second interdigital electrodes 12 extend substantially parallel to each other along a first direction D1, and are alternately arranged and spaced apart from each other along a second direction D2. The first direction D1 and the second direction D2 are parallel to a main surface (for example, the surface close to the interdigital transducer 101) of the piezoelectric substrate 100, and intersect with each other, for example, they are substantially perpendicular to each other. The first interdigital electrode lead-out part 21 is located at a side of the plurality of first interdigital electrodes 11 in the first direction D1 and is connected to the plurality of first interdigital electrodes 11, so that the plurality of first interdigital electrodes 11 are electrically connected with each other through the first interdigital electrode lead-out part 21. Similarly, the second interdigital electrode lead-out part 22 is located at a side of the plurality of second interdigital electrodes 12 in the first direction D1 and is connected to the plurality of second interdigital electrodes 12, so that the plurality of second interdigital electrodes 12 are electrically connected with each other through the second interdigital electrode lead-out part 22.

The first interdigital electrode lead-out part 21 and the second interdigital electrode lead-out part 22 are located at two opposite sides of the body region BR in the first direction D1. For example, the first interdigital electrode lead-out part 21 is located at a side of the first peripheral region GR1 away from the body region BR in the first direction D1, and the second interdigital electrode lead-out part 22 is located at a side of the second peripheral region GR2 away from the body region BR in the first direction. That is, in an extending direction of the interdigital electrodes (for example, in the first direction D1), the first peripheral region GR1 is located between the body region BR and the first interdigital electrode lead-out part 21, and the second peripheral region GR2 is located between the body region BR and the second interdigital electrode lead-out part 22. Herein, the body region BR refers to a region in which the first interdigital electrodes 11 and the second interdigital electrodes 12 completely overlap with each other in an arrangement direction of the interdigital electrodes (for example, in the second direction D2); in the peripheral region, the first interdigital electrode and the second interdigital electrode do not overlap with each other in the second direction. The body region BR and the peripheral region GR each include not only a layer where the interdigital transducer is located, but also layer(s) overlapping with the interdigital transducer in a direction perpendicular to the main surface of the piezoelectric substrate. Herein, multiple components being overlapped in a certain direction represents that orthographic projections of the multiple components on a reference plane perpendicular to the certain direction overlap with each other. That is, in the body region BR, orthographic projections of the first interdigital electrodes 11 and the second interdigital electrodes 12 on a reference plane (for example, a surface of a reflecting grating 102 close to the interdigital transducer) perpendicular to the second direction D2 completely overlap with each other.

Still referring to FIG. 1A and FIG. 1B, the first interdigital electrode 11 is located in the body region BR, and extends from the body region BR across the first peripheral region GR1 to be connected to the first interdigital electrode lead-out part 21. The second interdigital electrode 12 is located in the body region BR, and extends from the body region BR across the second peripheral region GR2 to be connected to the second interdigital electrode lead-out part 22. The first interdigital electrode 11 has a first electrode edge 11e, which is away from the first interdigital electrode lead-out part 21 and faces the second interdigital electrode lead-out part 22 in the first direction D1, and is spaced apart from the second interdigital electrode lead-out part 22 by the second peripheral region GR2. The second interdigital electrode 12 has a second electrode edge 12e, which is away from the second interdigital electrode lead-out part 22 and faces the first interdigital electrode lead-out part 21 in the first direction D1, and is spaced apart from the first interdigital electrode lead-out part 21 by the first peripheral region GR1.

The peripheral region GR may be defined by the corresponding electrode edge and the surface of the interdigital electrode lead-out part facing the electrode edge. For example, the first peripheral region GR1 may include a region located, in the first direction D1, between an expanded plane where the second electrode edge 12e expands along the second direction D2 and a third direction D3 and an expanded plane where the surface of the first interdigital electrode lead-out part 21 facing the second electrode edge 12e expands along the second direction D2 and the third direction D3. The second peripheral region GR2 may include a region located, in the first direction D1, between an expanded plane where the first electrode edge 11e expands along the second direction D2 and the third direction D3 and an expanded plane where the surface of the second interdigital electrode lead-out part 22 facing the first electrode edge 11e expands along the second direction D2 and the third direction D3. The third direction D3 is perpendicular to the main surface 100 of the piezoelectric substrate 100, and may be perpendicular to the first direction D1 and the second direction D2.

In some embodiments, the body region BR includes a central region C, and a first end region E1 and a second end region E2 located at two opposite sides of the central region C in the first direction D1; the first end region E1 is located between the central region C and the first peripheral region GR1, and the second end region E2 is located between the central region C and the second peripheral region GR2. The first interdigital electrode 11 and the second interdigital electrode 12 each include a central part, a first end part, a second end part and a connecting part. In each interdigital electrode, the first end part and the second end part are located at two opposite sides of the central part in the first direction, and the connecting part is located at a side of the second end part away from the central part and is connected to a corresponding one of the first interdigital electrode lead-out part and the second interdigital electrode lead-out part. In each interdigital electrode, the central part is located in the central region C, and the first end part is located in one of the first end region E1 and the second end region E2; the second end part is located in the other one of the first end region E1 and the second end region E2, and the connecting part is located in one of the first peripheral region GR1 and the second peripheral region GR2, wherein the first end part and the second end part can be collectively referred to as an end portion of the interdigital electrode; the first end region E1 and the second end region E2 may be collectively referred to as an end region. It should be understood that, the central part, the first end part, the second end part and the connecting part of each interdigital electrode are connected with each other and are continuous, and can be integrally formed. In some embodiments, in each interdigital electrode structure, the interdigital electrode and the interdigital electrode lead-out part may also be integrally formed. For example, as shown in FIG. 1B, the first interdigital electrode 11 includes a central part 11a located in the central region C, a first end part 11b located in the second end region E2, a second end part 11c located in the first end region E1, and a connecting part 11d located in the first peripheral region GR1. The second interdigital electrode 12 includes a central part 12a located in the central region, a first end part 12b located in the first end region E1, a second end part 12c located in the second end region E2, and a connecting part 12d located in the second peripheral region GR2. The central part 11a of the first interdigital electrode 11 and the central part 12a of the second interdigital electrode 12 overlap (for example, completely overlap) with each other in the second direction D2; the first end part 11b of the first interdigital electrode 11 and the second end part 12c of the second interdigital electrode 12 overlap (for example, completely overlap) with each other in the second direction D2; and the second end part 11c of the first interdigital electrode 11 and the first end part 12b of the second interdigital electrode 12 overlap (for example, completely overlap) with each other in the second direction D2. The connecting part 11d of the first interdigital electrode 11 is located in the first peripheral region GR1 and does not overlap with the second interdigital electrode 12 in the second direction D2; the connecting part 12d of the second interdigital electrode 12 is located in the second peripheral region GR2 and does not overlap with the first interdigital electrode 11 in the second direction D2.

In some embodiments, the clutter suppression structure 106 is disposed on a side of the interdigital transducer away from the piezoelectric substrate in the end regions and the peripheral regions, and overlaps with the end portions and the connecting parts of the first and second interdigital electrodes 11 and 12 in the direction perpendicular to the main surface of the piezoelectric substrate (for example, the third direction D3). The orthographic projection of the clutter suppression structure 106 on the piezoelectric substrate 100 is located outside the central region C, that is, is offset from the orthographic projections of the central part 11a of the first interdigital electrode 11 and the central part 12a of the second interdigital electrode 12 on the piezoelectric substrate 100. In some embodiments, the central region C is the effective resonance region of the surface acoustic wave resonator device.

In some embodiments, orthographic projections of the first and second end parts of the first interdigital electrode, and the first and second end parts of the second interdigital electrode on the piezoelectric substrate are located within a range of the orthographic projection of the clutter suppression structure on the piezoelectric substrate. In some embodiments, orthographic projections of a portion of the connecting part of the first interdigital electrode and a portion of the connecting part of the second interdigital electrode on the piezoelectric substrate are also located within a range of the orthographic projection of the clutter suppression structure on the piezoelectric substrate.

Referring to FIGS. 1A and 1B and FIGS. 2A to 2C, in some embodiments, the clutter suppression structure 106 includes a body structure BP and a sawtooth structure SP. The body structure BP extends continuously in the second direction D2, and overlaps with the end portions of the first interdigital electrode 11 and the second interdigital electrode 12 close to the peripheral region in the third direction D3 perpendicular to the main surface of the piezoelectric substrate 100. The sawtooth structure SP is located at a side of the body structure BP close to the peripheral region GR in the first direction D1, and protrudes from the body structure BP towards the peripheral region GR. At least part of the sawtooth structure SP overlaps with the first interdigital electrode 11 and/or the second interdigital electrode 12 in the third direction D3.

In some embodiments, the sawtooth structure SP extends beyond the first electrode edge 11e of the first interdigital electrode 11 and/or the second electrode edge 12e of the second interdigital electrode 12 in the first direction D1, and at least part of the sawtooth structure SP is located in the peripheral region GR.

For example, the clutter suppression structure 106 includes a first clutter suppression substructure 106a and a second clutter suppression substructure 106b. The first clutter suppression substructure 106a and the second clutter suppression substructure 106b are disposed side by side in the first direction D1 and located at two opposite sides of the central region C. One or more (for example, each) of the first clutter suppression substructure and the second clutter suppression substructure each include a body part and a sawtooth part which are connected with each other; the body part may continuously extend across a plurality of first interdigital electrodes and second interdigital electrodes along the second direction, and at least overlap with the end portions of the first interdigital electrodes and the second interdigital electrodes in the direction perpendicular to the main surface of the piezoelectric substrate. The sawtooth part is located at a side of the body part connected thereto, which side is close to the peripheral region and the interdigital electrode lead-out part and away from the central region; each body part has a body sidewall close to the peripheral region, and the sawtooth part protrude from the body sidewall of the corresponding body part in the first direction. The sawtooth part may be located in the end region and/or the peripheral region. For example, in some embodiments, the sawtooth part extends beyond the electrode edge of the corresponding interdigital electrode, and at least a portion of the sawtooth part may be located in the peripheral region and partially overlap with the connecting part of the corresponding interdigital electrode, but the present disclosure is not limited thereto.

During the operation of the surface acoustic wave resonator structure, the surface acoustic wave propagates along the arrangement direction (for example, the second direction D2) of the plurality of interdigital electrodes of the interdigital transducer 101. However, there may also exist some clutters propagating along the extension direction (for example, the first direction D1) of the interdigital electrodes, and such clutters will cause energy loss, which will further lead to the degradation of the performance of the resonator/filter. In the embodiment of the present disclosure, by disposing a clutter suppression structure including a first clutter suppression substructure and a second clutter suppression substructure that are located above the end portions and/or the connecting parts of a plurality of interdigital electrodes, a region or an interface where acoustic wave propagation impedance is changed can be generated, so as to suppress or eliminate the clutters propagating in the first direction D1 and to reflect the clutters propagating in the first direction D1 back into the resonator, thereby reducing or avoiding energy loss. In some embodiments, the clutter suppression capability of the clutter suppression structure mainly depends on a part thereof overlapping with the plurality of interdigital electrodes. Therefore, by increasing the overlapping area of the clutter suppression structure and the plurality of interdigital electrodes, the clutter suppression capability of the clutter suppression structure can be improved. Here, the overlapping area of the clutter suppression structure and the plurality of interdigital electrodes refers to the area of the part of the orthographic projection of the clutter suppression structure on the piezoelectric substrate overlapping with the orthographic projections of the plurality of interdigital electrodes on the piezoelectric substrate.

For example, the first clutter suppression substructure 106a includes a first body part 106a1 and a first sawtooth part 106a2 connected with each other; the second clutter suppression substructure 106b includes a second body part 106b1 and a second sawtooth part 106b2 connected with each other. The first body part 106a1 and the second body part 106b1 may extend continuously in the second direction D2 and substantially parallel to each other, and extend across the end portions of the plurality of first interdigital electrodes 11 and the plurality of second interdigital electrodes 12, respectively.

In some embodiments, orthographic projections of the second end part of the first interdigital electrode and the first end part of the second interdigital electrode on the piezoelectric substrate are located within the orthographic projection of the first body part on the piezoelectric substrate, and a portion of the connecting part of the first interdigital electrode overlaps with the first sawtooth part in a third direction; orthographic projections of the first end part of the first interdigital electrode and the second end part of the second interdigital electrode on the piezoelectric substrate are located within the orthographic projection of the second body part on the piezoelectric substrate, and a portion of the connecting part of the second interdigital electrode overlaps with the second sawtooth part in the third direction.

For example, the first body part 106a1 overlaps with the end portions of the first and second interdigital electrodes 11 and 12 close to the first peripheral region GR1 (i.e., the second end parts 11c of the first interdigital electrodes 11 and the first end parts 12b of the second interdigital electrodes 12) in the third direction D3, and overlaps, in the third direction D3, with a gap between the end portions of adjacent interdigital electrodes. The second body part 106b1 overlaps with the end portions of the first and second interdigital electrodes 11 and 12 close to the second peripheral region GR2 (i.e., the first end parts 11b of the first interdigital electrodes 11 and the second end parts 12c of the second interdigital electrodes 12) in the third direction D3, and overlaps, in the third direction D3, with the gap between the end portions of adjacent interdigital electrodes.

The first body part 106a1 has a first body sidewall S1a and a sidewall S1b that are opposite to each other in the first direction D1. The first body sidewall S1a is close to the first peripheral region GR1 and faces the first interdigital electrode lead-out part 21; and the sidewall S1b is away from the first peripheral region GR1 and close to the central region C. The second body part 106b1 has a second body sidewall S2a and a sidewall S2b that are opposite to each other in the first direction. The second body sidewall S2a is close to the second peripheral region GR2 and faces the second interdigital electrode lead-out part 22; and the sidewall S2b is away from the second peripheral region GR2 and close to the central region C.

In some embodiments, the first sawtooth part 106a2 is disposed at a side of the first body part 106a1 close to the first peripheral region GR1 in the first direction D1, and is connected to the first body part 106a1. For example, the first sawtooth part 106a2 protrudes from the first body sidewall S1 of the first body part 106a1 and towards the first interdigital electrode lead-out part 21 in the first direction D1. In some embodiments, the first sawtooth part 106a2 may extend beyond the second electrode edge 12e in the first direction D1; that is, in the first direction D1, the distance d1 between the first sawtooth part 106a2 and the first interdigital electrode lead-out part 21 may be smaller than the distance between the second electrode edge 12e and the first interdigital electrode lead-out part 21. At least a portion of the first sawtooth part 106a2 may be located in the first peripheral region GR1.

The second sawtooth part 106b2 is disposed at a side of the second body part 106b1 close to the second peripheral region GR2 in the first direction D1, and is connected to the second body part 106b1. For example, the second sawtooth part 106b2 protrudes from the second body sidewall S2a of the second body part 106b1 and towards the second interdigital electrode lead-out part 22 in the first direction D1. In some embodiments, the second sawtooth part 106b2 may extend beyond the first electrode edge 11e in the first direction D1; that is, in the first direction D1, the distance d2 between the second sawtooth part 106b2 and the second interdigital electrode lead-out part 22 may be smaller than the distance between the first electrode edge 11e and the second interdigital electrode lead-out part 22. At least a portion of the second sawtooth part 106b2 may be located in the second peripheral region GR2. It should be understood that in various embodiments, each sawtooth part and the corresponding interdigital electrode lead-out part are spaced apart from each other by a certain distance in the first direction, that is, the above-mentioned distance d1 and distance d2 are non-zero distances.

In some embodiments, at least a portion of the first sawtooth part 106a2 overlaps with the first interdigital electrode 11 (for example, connecting part 11d thereof) in the third direction D3, and at least a portion of the second sawtooth part 106b2 overlaps with the second interdigital electrode (for example, the connecting part 12d thereof) in the third direction D3. In some embodiments, in the third direction D3, the first sawtooth part 106a2 and the second sawtooth part 106b2 may not overlap with a gap region between adjacent interdigital electrodes and an extension region of the gap region extended in the first direction D1; that is, orthographic projections of the first sawtooth part 106a2 and the second sawtooth part 106b2 on the piezoelectric substrate 100 are offset from the orthographic projections of the gap region between adjacent interdigital electrodes and the extension region of the gap region extended in the first direction D1 on the piezoelectric substrate 100. Herein, the gap region between adjacent interdigital electrodes refers to a gap region between adjacent interdigital electrodes among a plurality of first interdigital electrodes 11 and a plurality of second interdigital electrodes 12 in the second direction D2, and the extension region of the gap region extended in the first direction D1 refers to a region formed by expanding the gap region along the first direction D1 with the same width.

Referring to FIGS. 1B and 2B, in some embodiments, each sawtooth part includes a plurality of extension parts, which may be arranged at intervals along the second direction and connected to corresponding body part. For example, the first sawtooth part 106A2 includes a plurality of first extension parts A2, which may be arranged at intervals along the second direction D2 and extend along the first direction D1 substantially parallel to each other. The second sawtooth part 106b2 includes a plurality of second extension parts B2, which may be arranged at intervals along the second direction D2 and extend along the first direction D1 substantially parallel to each other.

In some embodiments, the spacing s1 between adjacent first extension parts A2 among a plurality of first extension parts A2 in the second direction D2 may be approximately equal to the spacing s1 between adjacent second extension parts B2 among a plurality of second extension parts B2 in the second direction, and the spacing s1 between adjacent first extension parts A2 or the spacing s1 between adjacent second extension parts B2 may be greater than or approximately equal to the spacing s2 between adjacent interdigital electrodes in the second direction D2, but the present disclosure is not limited thereto. Here, the distance between two components in a certain direction refers to the distance between the surfaces of the two components facing each other in the certain direction.

In some embodiments, a plurality of extension parts may be disposed in one-to-one correspondence with a plurality of interdigital electrodes, that is, the sawtooth structure of each clutter suppression substructure is provided with an extension part at the position corresponding to each interdigital electrode. Here, the extension part and the interdigital electrode being disposed corresponding to each other represents that the orthographic projection of the extension part on the piezoelectric substrate and the orthographic projection of the interdigital electrode on the piezoelectric substrate are at least partially aligned in the first direction, and includes a case that the orthographic projection of the extension part overlaps with a portion of the orthographic projection of the interdigital electrode; or a case that the orthographic projection of the extension part and the orthographic projection of the interdigital electrode are not overlapped but border each other; or a case that the orthographic projection of the extension part and the orthographic projection of the interdigital electrode are neither overlapped nor border each other (i.e., are offset from each other), but at least partially aligned in the first direction; or the like.

In some embodiments, among the extension part and interdigital electrode overlapping with each other, the width of the extension part in the second direction may be less than or equal to the width of the corresponding interdigital electrode in the second direction, and the orthographic projection of the extension part on the piezoelectric substrate may be located within a range of the orthographic projection of the corresponding interdigital electrode on the piezoelectric substrate.

Referring to FIG. 1B and FIG. 2B, in some embodiments, the plurality of first extension parts A2 at least include a first sub-extension part a21; for example, a plurality of first sub-extension parts a21 may be disposed in one-to-one correspondence with a plurality of first interdigital electrodes 11, and each first sub-extension part a21 overlaps with a corresponding first interdigital electrode 11 (e.g., the connecting part 11d and/or the second end part 11c thereof) in the third direction D3. For example, the orthographic projection of the first sub-extension part a21 on the piezoelectric substrate 100 may be located within a range of the orthographic projection of the corresponding first interdigital electrode 11 on the piezoelectric substrate 100. The plurality of second extension parts B2 at least include a second sub-extension part b21; for example, a plurality of second sub-extension parts b21 may be disposed in one-to-one correspondence with a plurality of second interdigital electrodes 12, and each second sub-extension part b21 overlaps with a corresponding second interdigital electrode 12 (e.g., the connecting part 12d and/or the second end part 12c thereof) in the third direction D3. For example, the orthographic projection of each second sub-extension part b21 on the piezoelectric substrate 100 may be located within a range of the orthographic projection of the corresponding second interdigital electrode 12 on the piezoelectric substrate 100. In some embodiments, the first sub-extension parts a21 extend beyond the end portions of a plurality of interdigital electrodes in the first direction, and overlap with portions of the connecting parts 11d of the first interdigital electrodes 11 in the third direction D3; the second sub-extension parts b21 extend beyond the end portions of a plurality of interdigital electrodes in the first direction, and overlap with portions of the connecting parts 12d of the second interdigital electrodes 12 in the third direction D3.

In some embodiments, among the first sub-extension part a21 and the first interdigital electrode 11 overlapping with each other, the width of the first sub-extension part a21 in the second direction D2 may be approximately equal to the width of the first interdigital electrode 11 in the second direction D2. The sidewalls of the first sub-extension part a21 opposite to each other in the second direction D2 may be respectively aligned, in the third direction D3, with portions of the sidewalls of the first interdigital electrode 11 opposite to each other in the second direction D2. Among the second sub-extension part b21 and the second interdigital electrode 12 overlapping with each other, the width of the second sub-extension part b21 in the second direction D2 may be approximately equal to the width of the second interdigital electrode 12 in the second direction D2. The sidewalls of the second sub-extension part b21 opposite to each other in the second direction D2 may be respectively aligned, in the third direction D3, with portions of the sidewalls of the second interdigital electrode 12 opposite to each other in the second direction D2. Here, the sidewalls of the sub-extension part or the interdigital electrode opposite to each other in the second direction refer to their respective two sidewalls extending along the first direction D1 and opposite to each other in the second direction D2.

In an alternative embodiment, among the first sub-extension part a21 and the first interdigital electrode 11 overlapping with each other, the width of the first sub-extension part a21 in the second direction D2 may also be smaller than the width of the corresponding first interdigital electrode 11 in the second direction D2. Similarly, among the second sub-extension part b21 and the second interdigital electrode 12 overlapping with each other, the width of the second sub-extension part b21 in the second direction D2 may also be smaller than the width of the second interdigital electrode 12 in the second direction D2.

In some embodiments, among the sub-extension parts and the interdigital electrodes overlapping with each other, the width of the sub-extension part is disposed to be smaller than or equal to the width of the corresponding interdigital electrode, and the orthographic projection of the sub-extension part on the piezoelectric substrate is configured to be located within a range of the orthographic projection of the corresponding interdigital electrode, so as to maximum the overlapping area of the sub-extension part and the interdigital electrode in a case that the sub-extension part has a certain area (for example, a relatively small area), thereby improving the clutter suppression capability of the clutter suppression structure to the greatest extent while reducing the metal coverage area of the clutter suppression structure (e.g., a metal structure) to lower the ohmic loss.

In some embodiments, in the first sawtooth part 106a2 and/or the second sawtooth part 106b2, the plurality of extension parts may further include additional sub-extension parts. For example, the plurality of first extension parts further include a first additional sub-extension part, and the orthographic projection of the first additional sub-extension part on the piezoelectric substrate is at least partially aligned with the orthographic projection of the second interdigital electrode on the piezoelectric substrate in the first direction; the plurality of second extension parts further include a second additional sub-extension part, and the orthographic projection of the second additional sub-extension part on the piezoelectric substrate is at least partially aligned with the orthographic projection of the first interdigital electrode on the piezoelectric substrate in the first direction.

Referring to FIG. 1B and FIG. 2B, for example, at least a portion of the additional sub-extension part may be located in the peripheral region, and may not overlap with the interdigital electrode in the direction perpendicular to the main surface of the piezoelectric substrate. For example, in the first sawtooth part 106a2, the plurality of first extension parts A2 further include one or more first additional sub-extension parts a22, the first additional sub-extension part a22 is located on a side of the first sub-extension parts a21 in the second direction D2 and spaced apart from the first sub-extension parts a21. For example, a plurality of first sub-extension parts a21 and a plurality of first additional sub-extension parts a22 are alternately arranged in the second direction D2. In some embodiments, the first additional sub-extension part a22 may be disposed at a position corresponding to the second interdigital electrode 12 and extend beyond the second electrode edge 12e in the first direction D1; the orthographic projection of the first additional sub-extension part a22 on the piezoelectric substrate may be aligned with the orthographic projection of the second interdigital electrode 12 on the piezoelectric substrate in the first direction D1; and the orthographic projection of the first additional sub-extension part a22 is located on a side of the orthographic projection of the second interdigital electrode 12 close to the first interdigital electrode lead-out part 21. For example, the orthographic projection of the first additional sub-extension part a22 may border but not overlap with the orthographic projection of the second electrode edge 12e of the second interdigital electrode 12 on the piezoelectric substrate.

In some embodiments, in the first sawtooth part 106A2, the plurality of first extension parts A2 include a plurality of first sub-extension parts a21 and a plurality of first additional sub-extension parts a22, and the plurality of first sub-extension parts a21 and the plurality of first additional sub-extension parts a22 may be alternately arranged along the second direction D2 and spaced apart from each other.

For example, in the second sawtooth part 106b2, the plurality of second extension parts B2 further include one or more second additional sub-extension parts b22, the additional sub-extension part b22 is located on a side of the second sub-extension parts b21 in the second direction D2 and spaced apart from the second sub-extension parts b21. In some embodiments, the second additional sub-extension part b22 may be disposed at a position corresponding to the first interdigital electrode 11 and extend beyond the first electrode edge 11e in the first direction D1; the orthographic projection of the second additional sub-extension part b22 on the piezoelectric substrate may be aligned with the orthographic projection of the first interdigital electrode 11 on the piezoelectric substrate in the first direction D1; and the orthographic projection of the second additional sub-extension part b22 is located on a side of the orthographic projection of the first interdigital electrode 11 close to the second interdigital electrode lead-out part 22. For example, the orthographic projection of the second additional sub-extension part b22 may border but not overlap with the orthographic projection of the first electrode edge 11e of the first interdigital electrode 11 on the piezoelectric substrate.

In some embodiments, in the second sawtooth part 106b2, the plurality of second extension parts B2 include a plurality of second sub-extension parts b21 and a plurality of second additional sub-extension parts b22, which may be alternately arranged along the second direction D2 and spaced apart from each other. In some embodiments, in regions where the first clutter suppression substructure and the second clutter suppression substructure overlap with the interdigital transducer, the widths of a plurality of extension parts may be approximately equal to the widths of the corresponding plurality of interdigital electrodes, respectively, and the spacing between adjacent extension parts may be approximately equal to the spacing between adjacent interdigital electrodes.

Referring to FIGS. 1A and 1B and FIGS. 2A to 2C, in some embodiments, the orthographic projection of the body sidewall of the body part of the clutter suppression structure close to the peripheral region on the piezoelectric substrate may be aligned with the orthographic projection of the corresponding electrode edge on the piezoelectric substrate in the second direction D2. For example, the orthographic projection of the first body sidewall S1a of the first body part 106a1 on the piezoelectric substrate 100 and the orthographic projection of the second electrode edge 12e on the piezoelectric substrate 100 are aligned with each other in the second direction D2; the orthographic projection of the second body sidewall S2a of the second body part 106b1 on the piezoelectric substrate 100 and the orthographic projection of the first electrode edge 11e on the piezoelectric substrate 100 are aligned with each other in the second direction D2. In other words, a boundary between the body part and the sawtooth part may be substantially aligned with the corresponding electrode edge in the third direction perpendicular to the main surface of the piezoelectric substrate. For example, the boundary between the first body part 106a1 and the first sawtooth part 106a2 may be substantially aligned with the second electrode edge 12e in the third direction D3; the boundary between the second body part 106b1 and the second sawtooth part 106b2 may be substantially aligned with the first electrode edge 11e in the third direction D3. However, the present disclosure is not limited thereto.

In this embodiment, the sawtooth structure SP is entirely located in the peripheral region GR. For example, the first sawtooth part 106a2 may be entirely located in the first peripheral region GR1, wherein the orthographic projection of the first sub-extension part a21 on the piezoelectric substrate is located within a range of the orthographic projection of the connecting part 11d of the first interdigital electrode 11 on the piezoelectric substrate, and the whole first additional sub-extension part a22 extends beyond the second electrode edge 12e, but is not overlapped with the second electrode 12 in the third direction; the second sawtooth part 106b2 may be entirely located in the second peripheral region GR2, wherein the orthographic projection of the second sub-extension part b21 on the piezoelectric substrate 100 is located in the orthographic projection of the connecting part 12d of the second interdigital electrode 12 on the piezoelectric substrate, and the whole second additional sub-extension part b22 extends beyond the first electrode edge 11e, but is not overlapped with the first electrode 11 in the third direction.

Referring to FIG. 1B, in some embodiments, the peripheral width of each peripheral region is defined by the distance between the corresponding electrode edge and the interdigital electrode lead-out part in the first direction. For example, the first peripheral region GR1 has a first peripheral width W1, and the first peripheral width W1 is defined by the distance between the second electrode edge 12e and the first interdigital electrode lead-out part 21 in the first direction D1, that is, approximately equal to the distance between the second electrode edge 12e and the surface of the first interdigital electrode lead-out part 21 facing the second electrode edge 12e in the first direction D1. The second peripheral region GR2 has a second peripheral width W2, and the second peripheral width W2 is defined by the distance between the first electrode edge 11e and the second interdigital electrode lead-out part 22 in the first direction D1, that is, approximately equal to the distance between the first electrode edge 11e and the surface of the second interdigital electrode lead-out part 22 facing the first electrode edge 11e in the first direction D1.

In some embodiments, as shown in FIG. 1B, in the first direction D1, the distance between the first body sidewall S1a of the first body part 106a and the first interdigital electrode lead-out part 21 is approximately equal to the first peripheral width W1; the distance between the second body sidewall S2a of the second body part 106b and the second interdigital electrode lead-out part 22 may be approximately equal to the second peripheral width W2.

In this embodiment, the width L1 of the first sawtooth part 106a2 in the first direction D1 (that is, the extension length of the first extension part A2 in the first direction D1) is less than or equal to 20% of the first peripheral width W1; the width L2 of the second sawtooth part 106b2 in the first direction D1 (that is, the extension length of the second extension part B2 in the first direction D1) is less than or equal to 20% of the second peripheral width W2. The extension lengths of a plurality of first extension parts A2 in the first sawtooth part 106a2 may be approximately equal to or different from each other, and the extension length of each first extension part is within 20% of the first peripheral width W1. The extension lengths of a plurality of second extension parts B2 in the second sawtooth part 106b2 may be approximately equal to or different from each other, and the extension length of each second extension part is within 20% of the second peripheral width W2.

In some embodiments, the range of the first peripheral width W1 and the range of the second peripheral width W2 may each be within 0.1 to 2 times of the wavelength. The width W3 of the first body part 106a1 and the width W4 of the second body part 106b1 may each be set within 0.25 to 0.5 times of the wavelength. The width of the first sawtooth part 106a2 and the width of the second sawtooth part 106b2 may each be set within 0.1 to 0.5 times of the wavelength. It should be understood that the width here refers to the width in the first direction D1, and the wavelength refers to the operating wavelength of the resonator device, which is equal to the ratio of the sound speed to the frequency (i.e., the resonant frequency of the resonator device). Furthermore, the wavelength=sound speed-frequency.

In some embodiments, as shown in FIGS. 1B and 2A, in the clutter suppression structure, the thicknesses of the body part and the sawtooth part in the direction perpendicular to the main surface of the piezoelectric substrate may be approximately equal to each other. In some embodiments, the normalized thickness of the body structure BP may range from about 0.03 to 0.12, and the normalized thickness of the sawtooth structure SP may range from about 0.03 to 0.12. Here, normalized thickness=equivalent film thickness-wavelength.

In each of the first clutter suppression substructure and the second clutter suppression substructure, the widths of the body part and the sawtooth part in the first direction may be equal to or different from each other. In some embodiments, the width of the sawtooth part in the first direction may be less than or equal to the width of the body part in the first direction; in some other embodiments, the width of the sawtooth part in the first direction may also be greater than the width of the body part in the first direction.

Referring to FIGS. 1A, 1B, and FIGS. 2A to 2C, in some embodiments, the orthographic projections of the first end parts 11b, the second end parts 11c and portions of the connecting parts 11d of the plurality of first interdigital electrodes 11 on the piezoelectric substrate 100, and the orthographic projections of the first end parts 12b, the second end parts 12c and portions of the connecting parts 12d of the plurality of second interdigital electrodes 12 on the piezoelectric substrate 100 may be located in a range of the orthographic projections of the first clutter suppression substructure and the second clutter suppression substructure of the clutter suppression structure 106 on the piezoelectric substrate 100.

In some embodiments, the orthographic projections of the second end parts 11c of the first interdigital electrodes 11 and the first end parts 12b of the second interdigital electrodes 12 on the piezoelectric substrate are located within a range of the orthographic projection of the first body part 106a1 on the piezoelectric substrate. The orthographic projections of portions of the connecting parts 11d of the first interdigital electrodes 11 on the piezoelectric substrate 100 overlap with the orthographic projection of the first sawtooth part 106a2 on the piezoelectric substrate, for example, are within a range of the orthographic projection of the first sawtooth part 106a2 on the piezoelectric substrate.

In some embodiments, the orthographic projections of the first end parts 11b of the first interdigital electrodes 11 and the second end parts 12c of the second interdigital electrodes 12 on the piezoelectric substrate are located within a range of the orthographic projection of the second body part 106b1 on the piezoelectric substrate. The orthographic projections of portions of the connecting parts 12d of the second interdigital electrodes 12 on the piezoelectric substrate 100 overlap with the orthographic projection of the second sawtooth part 106b2 on the piezoelectric substrate, for example, are within a range of the orthographic projection of the second sawtooth part 106b2 on the piezoelectric substrate.

Referring to FIG. 2A to FIG. 2C, in some embodiments, the surface acoustic wave resonator device 500a further includes a dielectric layer 102, which is disposed on the piezoelectric substrate 100 and covers the interdigital transducer; for example, the dielectric layer 102 may at least cover the sidewalls of a plurality of interdigital electrodes and the surfaces of the plurality of interdigital electrodes at a side away from the piezoelectric substrate 100, or the dielectric layer 102 may further cover the sidewalls of a plurality of interdigital electrode lead-out parts and the surfaces of the plurality of interdigital electrode lead-out parts at a side away from the piezoelectric substrate 100. In some embodiments, the clutter suppression structure 106 is located on a side of the dielectric layer 102 away from the piezoelectric substrate 100, that is, a part of the dielectric layer 102 is located between the clutter suppression structure 106 and the interdigital electrodes in the third direction D3 perpendicular to the main surface of the piezoelectric substrate, and the clutter suppression structure 106 is spaced apart from the interdigital electrodes by the part of the dielectric layer 102. In some embodiments, the surface acoustic wave resonator device 500a may further include a dielectric layer 108, which is disposed on a side of the dielectric layer 102 away from the piezoelectric substrate 100 and may cover the sidewalls of the clutter suppression structure 106 and the surface of the clutter suppression structure 106 at a side away from the piezoelectric substrate.

The dielectric layer 102 and the dielectric layer 108 may be used as temperature compensation layers, and may include temperature compensation materials such as silicon oxide. The dielectric layer 102 and the dielectric layer 108 may jointly constitute a temperature compensation structure. In some embodiments, the dielectric layer 108 may also be omitted, that is, the temperature compensation structure may only include the dielectric layer 102.

In some embodiments, the surface acoustic wave resonator device 500a may further include a first conductive connector 31, a second conductive connector 32, and a passivation layer 110. For example, the first conductive connector 31 extends through the dielectric layers 108 and 102 to be electrically connected to the first interdigital electrode lead-out part 21; the second conductive connector 32 extends through the dielectric layers 108 and 102 to be electrically connected to the second interdigital electrode lead-out part 22.

The passivation layer 110 may be disposed on a side of the temperature compensation structure away from the piezoelectric substrate, for example, on a side of the dielectric layer 108 away from the piezoelectric substrate 100, and cover portions of surfaces of the first conductive connector 31 and the second conductive connector 32. For example, the passivation layer 110 may cover the sidewalls of the first conductive connector 31 and the second conductive connector 32, and portions of surfaces of the first conductive connector 31 and the second conductive connector 32 away from the piezoelectric substrate. The passivation layer 110 may have a plurality of openings, including, for example, a first passivation opening 110a and a second passivation opening 110b, which respectively expose portions of surfaces of the first conductive connector 31 and the second conductive connector 32 at a side away from the piezoelectric substrate 100, so as to provide external connection windows. In some embodiments, the dielectric layer 108 may be omitted, and the passivation layer 110 may be formed on a side of the dielectric layer 102 away from the piezoelectric substrate 100 and cover the clutter suppression structure 106, but the present disclosure is not limited thereto.

For the convenience of understanding, in the cross-sectional views of FIGS. 2A to 2C, the structure of the passivation openings in the cross-sectional view is schematically shown, but the positions of the passivation openings in FIGS. 2A to 2C may not completely correspond to the positions of the passivation openings in FIG. 1A. It should be understood that, the positions of the passivation openings can be appropriately adjusted and configured according to product designs and requirements.

Referring to FIG. 1A, in some embodiments, the surface acoustic wave resonator device 500a further includes a reflecting grating 102a and a reflecting grating 102b (collectively referred to as reflecting gratings 102). The reflecting gratings 102 and the interdigital transducer 101 may be disposed in the same layer. That is, the reflecting gratings 102 and the interdigital transducer 101 may be formed from the same one material layer through the same one patterning process, but the present disclosure is not limited thereto.

The reflecting grating 102a and the reflecting grating 102b are disposed on two opposite sides of the interdigital transducer 101 in the second direction D2, and each reflecting grating includes a plurality of reflective electrodes 52 and a busbar 53. For example, in each reflecting grating, the plurality of reflective electrodes 52 extend along the first direction D1 substantially parallel to each other and are arranged at intervals along the second direction D2, and the busbar 53 extends along the second direction D2 and is connected to the plurality of reflective electrodes 52. For example, two busbars 53 are located on two opposite sides of the plurality of reflective electrodes 52 in the first direction D1, and may be substantially parallel to each other, and each electrically connected to the plurality of reflective electrodes 52. The number of the reflective electrodes 52 in the reflecting grating 102a may be as same as or different from the number of the reflective electrodes 52 in the reflecting grating 102b. It should be understood that, the number of the first interdigital electrodes, the number of the second interdigital electrodes and the number of the reflective electrodes in the reflecting grating shown in the drawings are only for illustration, and the present disclosure is not limited thereto.

In some embodiments, the clutter suppression structure 106 may further extend to the region where the reflecting grating 102 is located, and the clutter suppression structure 106 may further partially overlap with the reflecting grating 102 in the third direction D3 perpendicular to the main surface of the piezoelectric substrate 100, for example, partially overlap with a plurality of reflective electrodes 52.

For example, the clutter suppression structure 106 has an additional region AP, and the clutter suppression structure 106 overlaps with the reflecting grating 102 in the additional region AP in the third direction D3 perpendicular to the main surface of the piezoelectric substrate. For example, the first clutter suppression substructure 106a and the second clutter suppression substructure 106b each have a central region overlapping with the interdigital transducer in the third direction, and an additional region AP overlapping with one or more reflecting gratings 102. For example, in each clutter suppression substructure, two additional regions AP are disposed at two opposite sides of the central region in the second direction D2, and may be disposed in one-to-one correspondence with two reflecting gratings 102. In the clutter suppression substructure, the structure of the additional region AP is similar to that of the central region; that is, the clutter suppression substructure is also provided with a body part and a sawtooth part in the additional region AP.

For example, the first body part 106a1 and the second body part 106b1 each extend from the central region to the additional region in the second direction D2, and continuously extend across the plurality of interdigital electrodes of the interdigital transducer and the plurality of reflective electrodes 52 of the reflecting gratings 102. That is, the first body part 106a1 and the second body part 106b1 may each overlap with a plurality of interdigital electrodes of the interdigital transducer and a plurality of reflective electrodes 52 of the reflecting gratings 102 in a third direction D3 perpendicular to the main surface of the piezoelectric substrate, and overlap, in the third direction D3, with a gap region between adjacent interdigital electrodes, a gap region between adjacent reflective electrodes, and a gap region between the interdigital electrode and the reflective electrode which are adjacent to each other.

In some embodiments, in the additional regions of the respective clutter suppression substructures, a plurality of extension parts included in the first sawtooth part 106a2 or the second sawtooth part 106b2 may be disposed in one-to-one correspondence with a plurality of reflective electrodes, and each extension part overlaps with a corresponding one of the reflective electrodes 52 in the third direction D3. For example, the orthographic projection of each extension part on the piezoelectric substrate may be located within the orthographic projection of the corresponding reflective electrode on the piezoelectric substrate.

For example, in the first sawtooth part 106A2, the plurality of first extension parts A2 include a plurality of additional extension parts a23 located in the additional region AP. The plurality of additional extension parts a23 are arranged at intervals along the second direction D2, and may be disposed in one-to-one correspondence with a plurality of reflective electrodes 52, and respectively overlap with the plurality of reflective electrodes 52 in the third direction D3 perpendicular to the main surface of the piezoelectric substrate. The number of the plurality of additional extension parts a23 may be as same as or different from the number of the plurality of reflective electrodes 52. In the second sawtooth part 106b2, the plurality of second extension parts B2 include a plurality of additional extension parts b23 located in the additional region AP. The plurality of additional extension parts b23 may be disposed in one-to-one correspondence with a plurality of reflective electrodes 52, and respectively overlap with the plurality of reflective electrodes 52 in the third direction D3 perpendicular to the main surface of the piezoelectric substrate. The number of the plurality of additional extension parts b23 may be as same as or different from the number of the plurality of reflective electrodes 52.

In some embodiments, in the first sawtooth part 106a2 or the second sawtooth part 106b2, the orthographic projection of the additional extension part on the piezoelectric substrate may be located within a range of the orthographic projection of the reflecting grating (e.g., its reflective electrode) on the piezoelectric substrate. For example, in the second direction D2, the spacing between adjacent additional extension parts may be approximately equal to the spacing between adjacent reflective electrodes 52, and the width of the additional extension part may be approximately equal to the width of the corresponding reflective electrode (i.e., the reflective electrode overlapping with the additional extension part in the third direction). In the reflective electrode and the additional extension part overlapping with each other in the third direction, two sidewalls of the reflective electrode opposite to each other in the second direction D2 may be approximately aligned, in the third direction, with two sidewalls of the additional extension part opposite to each other in the second direction D2, respectively. In an alternative embodiment, in the second direction D2, the spacing between adjacent additional extension parts may also be greater than the spacing between adjacent reflective electrodes 52, and the width of the additional extension part may be smaller than the width of the corresponding reflective electrode.

In some other embodiments, the clutter suppression structure may be only disposed in the region where the interdigital transducer is located, without extending to the region where the reflecting grating is located. That is, the additional region AP of the clutter suppression structure may be omitted.

Figure 3A:
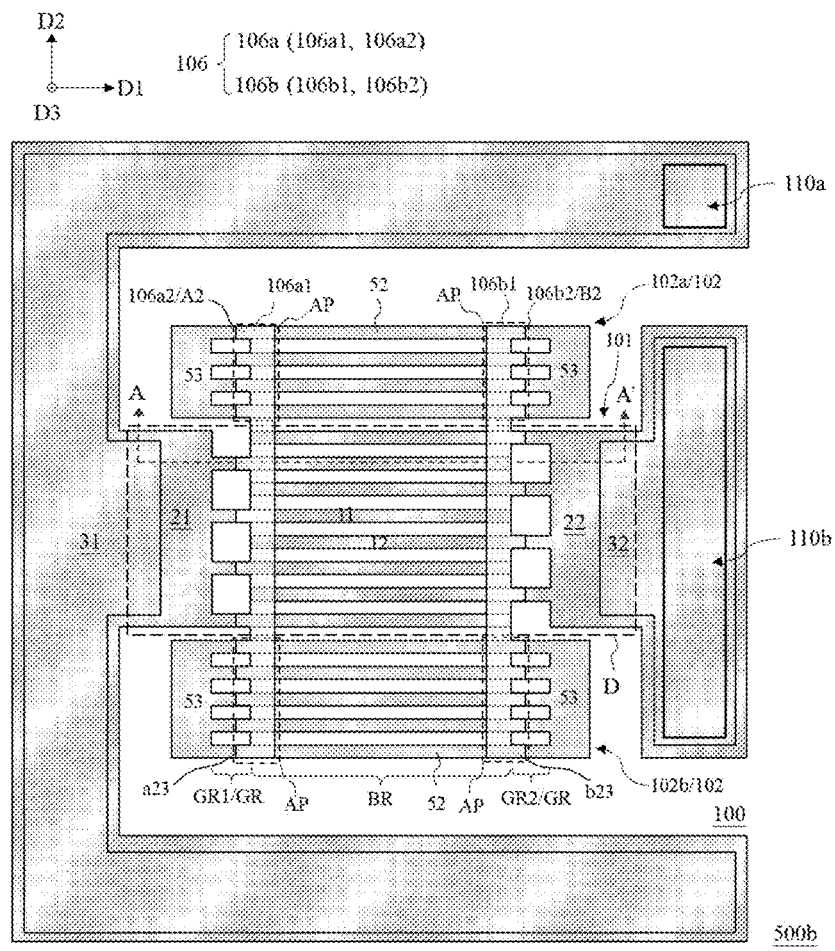
FIG. 3A illustrates a schematic top view of a surface acoustic wave resonator device according to some other embodiments of the present disclosure.
Figure 3B:
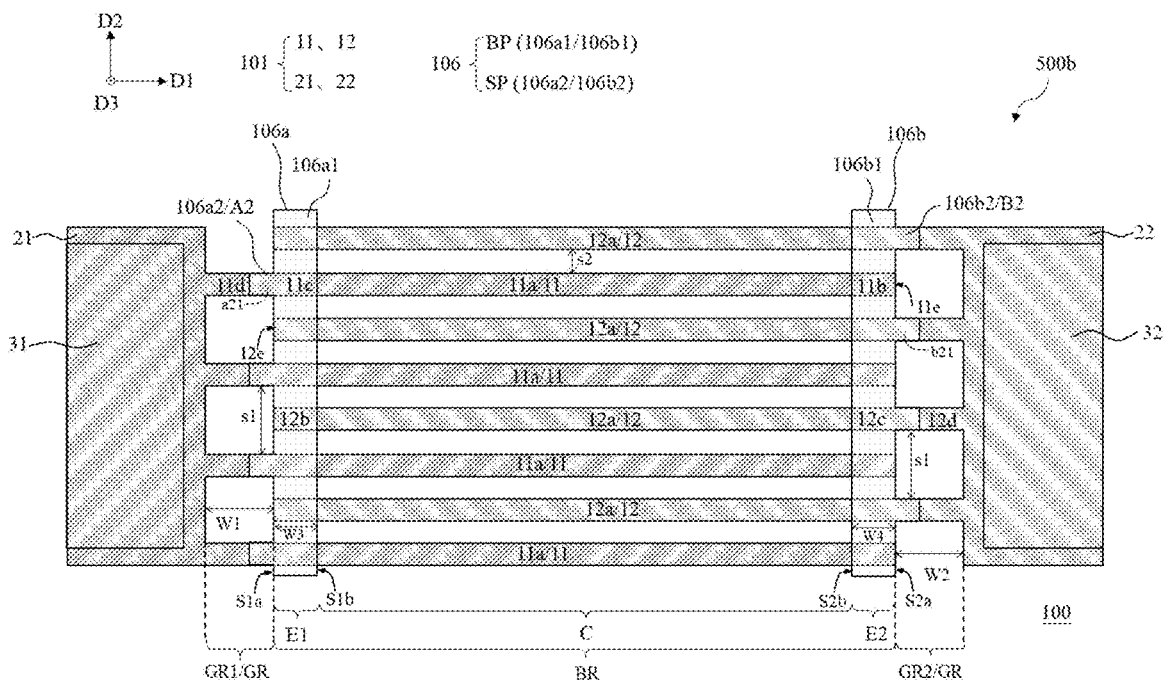
FIG. 3B illustrates a schematic enlarged top view of a partial region of the surface acoustic wave resonator device shown in FIG. 3A according to some other embodiments of the present disclosure.

FIG. 3A illustrates a schematic top view of a surface acoustic wave resonator device 500b according to some other embodiments of the present disclosure, and FIG. 3B illustrates a schematic enlarged top view of a region D of FIG. 3A. The structure of the surface acoustic wave resonator device 500b is similar to that of the surface acoustic wave resonator device 500a, with the difference that the additional sub-extension parts in the sawtooth part is omitted in the surface acoustic wave resonator device 500b.

Referring to FIGS. 3A and 3B, in some embodiments, in the first sawtooth part 106A2, a plurality of extension parts A2 include a first sub-extension part a21, but may not include the first additional sub-extension part a22 shown in FIGS. 1A and 1B. In the second sawtooth part 106b2, a plurality of extension parts B2 include a second sub-extension part b21, but may not include the second additional sub-extension part b22 shown in FIGS. 1A and 1B.

In this embodiment, the spacing s1 between two adjacent extension parts among the plurality of first extension parts A2 or the spacing s1 between two adjacent extension parts among the plurality of second extension parts B2 is greater than the spacing s2 between adjacent interdigital electrodes.

In the first clutter suppression substructure 106a, the first body sidewall Sla of the first body part 106a1 may have a portion aligned with the second electrode edge 12e in the third direction D3, and the plurality of first extension parts A2 of the first sawtooth part 106a2 are located in the first peripheral region GR1 and may each overlap with the interdigital electrode or the reflecting grating in the third direction. For example, the orthographic projection of the first sawtooth part 106a2 on the piezoelectric substrate may be located within a range of the orthographic projections of a plurality of first interdigital electrodes and/or reflecting gratings on the piezoelectric substrate.

In the second clutter suppression substructure 106b, the second body sidewall S2a of the second body part 106b1 may have a portion aligned with the first electrode edge 11e in the third direction D3, and the plurality of second extension parts B2 of the second sawtooth part 106b2 are located in the second peripheral region GR2 and may each overlap with the interdigital electrode or the reflecting grating in the third direction. For example, the orthographic projections of the plurality of second extension parts B2 on the piezoelectric substrate may be located within a range of the orthographic projections of the plurality of second interdigital electrodes and/or the reflecting gratings on the piezoelectric substrate.

In the embodiments shown in FIG. 1A to FIG. 3B, the boundary between the body part and the sawtooth part is aligned with the corresponding electrode edge; all the body parts are located in the end region and all the sawtooth parts are located in the peripheral region, but the present disclosure is not limited thereto. In alternative embodiments, the boundary between the body part and the sawtooth part may also be offset in the first direction with respect to the corresponding electrode edge, so that the body part may be located in both the end region and the peripheral region, or the sawtooth part may be located in both the end region and the peripheral region. Some examples of the alternative embodiments are described below with reference to the drawings.

In some examples, the sawtooth structure further includes at least one of the following features: the first sawtooth part further includes a portion overlapping with the second interdigital electrode in the third direction; the second sawtooth part further includes a portion overlapping with the first interdigital electrode in the third direction.

Figure 4A:
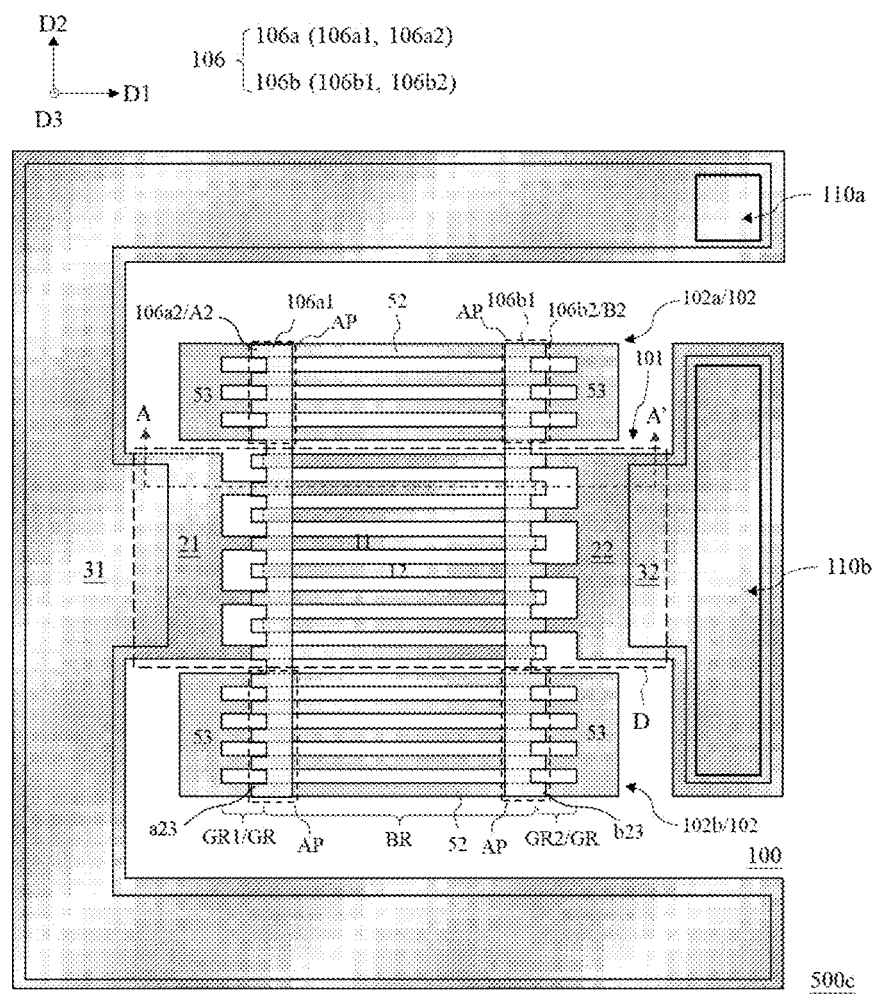
FIG. 4A illustrates a schematic top view of a surface acoustic wave resonator device according to some further embodiments of the present disclosure.
Figure 4B:
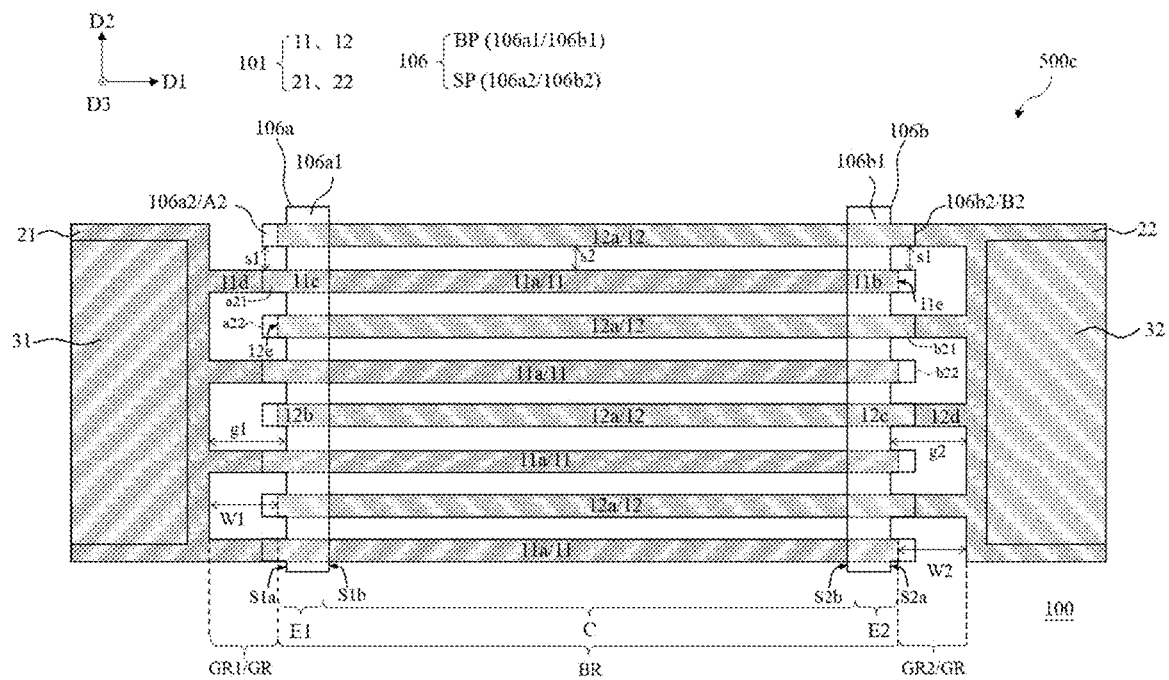
FIG. 4B illustrates a schematic enlarged top view of a partial region of the surface acoustic wave resonator device shown in FIG. 4A according to some further embodiments of the present disclosure.

FIG. 4A illustrates a schematic top view of a surface acoustic wave resonator device 500c according to some further embodiments of the present disclosure; FIG. 4B illustrates a schematic enlarged top view of a region D of FIG. 4A.

Referring to FIG. 4A and FIG. 4B, in some embodiments, in the first clutter suppression substructure 106a, the boundary between the first body part 106a1 and the first sawtooth part 106a2 (or the first body sidewall Sla) may be offset in the first direction D1 away from the first peripheral region GR1 with respect to the second electrode edge 12e; that is, in the first direction D1, the distance g1 between the first body sidewall Sla and the first interdigital electrode lead-out part 21 is greater than the distance between the second electrode edge 12e and the first interdigital electrode lead-out part 21 (i.e., the first peripheral width W1). In the second clutter suppression substructure 106b, the boundary between the second body part 106b1 and the second sawtooth part 106b2 (or the second body sidewall S2a) may be offset in the first direction D1 away from the second peripheral region GR2 with respect to the first electrode edge 11e; that is, in the first direction D1, the distance g2 between the second body sidewall S2a and the second interdigital electrode lead-out part 22 is greater than the distance between the first electrode edge 11e and the second interdigital electrode lead-out part 22 (i.e., the second peripheral width W2).

In this embodiment, the end portions of a plurality of interdigital electrodes not only overlap with the body part of the clutter suppression structure, but also partially overlap with the sawtooth part. For example, in the third direction D3, the second end part 11c of the first interdigital electrode 11 and the first end part 12b of the second interdigital electrode 12 overlap with the first body part 106a1, and also overlap with the first sawtooth part 106a2; the first end part 11b of the first interdigital electrode 11 and the second end part 12c of the second interdigital electrode 12 overlap with the second body part 106b1, and also overlap with the second sawtooth part 106b2.

The first sawtooth part 106a2 and the second sawtooth part 106b2 each extend from the end region into the peripheral region; that is, each sawtooth part includes a portion located in the end region, and another portion extending beyond the corresponding electrode edge in the first direction and located in the peripheral region. In this example, the orthographic projection of the first additional sub-extension part of the first sawtooth part on the piezoelectric substrate may partially overlap with the orthographic projection of the second interdigital electrode on the piezoelectric substrate, and the orthographic projection of the second additional sub-extension part of the second sawtooth part on the piezoelectric substrate may partially overlap with the orthographic projection of the first interdigital electrode on the piezoelectric substrate.

Among a plurality of first extension parts A2 of the first sawtooth part 106a2, a portion of the first sub-extension part a21 overlaps with the second end part of the first interdigital electrode 11 in the third direction, and another portion of the first sub-extension part a21 overlaps with the connecting part 11d of the first interdigital electrode in the third direction; a portion of the first additional sub-extension part a22 overlaps with the first end part 12b of the second interdigital electrode 12 in the third direction, and another portion of the first additional sub-extension part a22 extends beyond the second electrode edge 12e, and does not overlap with the interdigital electrode in the third direction.

Among a plurality of second extension parts B2 of the second sawtooth part 106b2, a portion of the second sub-extension part b21 overlaps with the second end part of the second interdigital electrode 12 in the third direction, and another portion of the second sub-extension part b21 overlaps with the connecting part 12d of the second interdigital electrode in the third direction; a portion of the second additional sub-extension part b22 overlaps with the first end part 11b of the first interdigital electrode 11 in the third direction, and another portion of the second additional sub-extension part b22 extends beyond the first electrode edge 11e, and does not overlap with the interdigital electrode in the third direction. Among a plurality of first extension parts or a plurality of second extension parts, the width of the sub-extension part in the first direction is as same as or different from the width of the additional sub-extension part in the first direction. For example, the width of the sub-extension part may be greater than or equal to the width of the additional sub-extension part.

In some alternative embodiments, portions of the first and second additional sub-extension parts a22 and b22 shown in FIGS. 4A and 4B that extend beyond the corresponding electrode edges may be removed, so that the orthographic projection of the additional sub-extension part on the piezoelectric substrate is also located within a range of the orthographic projection of the corresponding interdigital electrode on the piezoelectric substrate. In this example, in each sawtooth part, the width of the sub-extension part in the first direction may be greater than the width of the additional sub-extension part in the first direction.

Figure 5A:
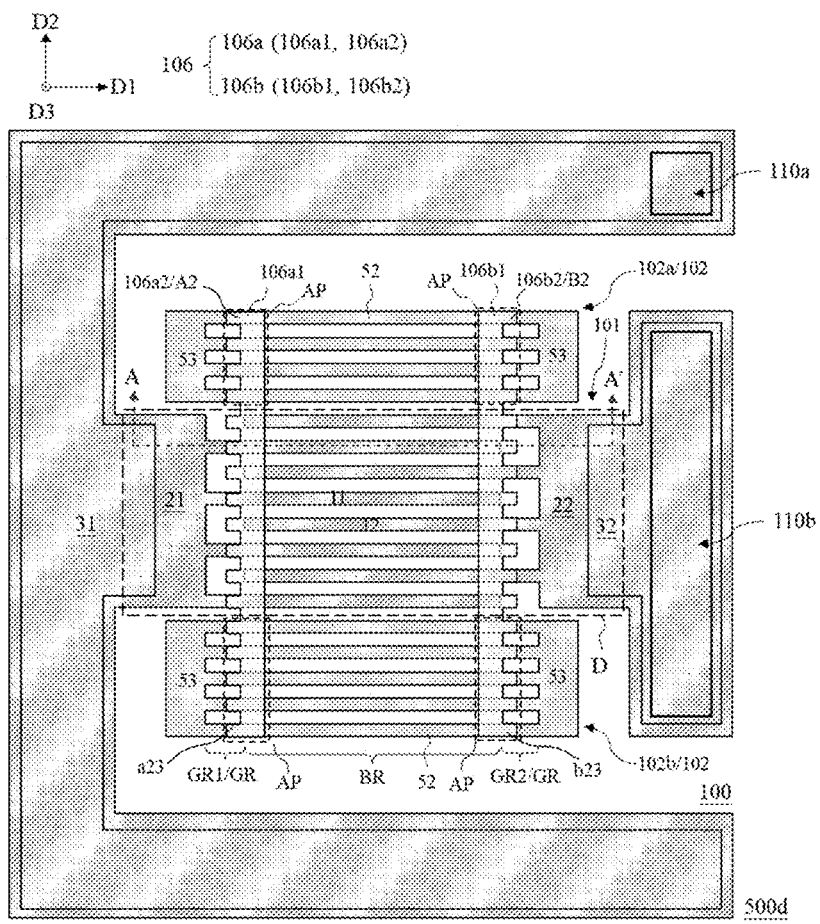
FIG. 5A illustrates a schematic top view of a surface acoustic wave resonator device according to still some other embodiments of the present disclosure.
Figure 5B:
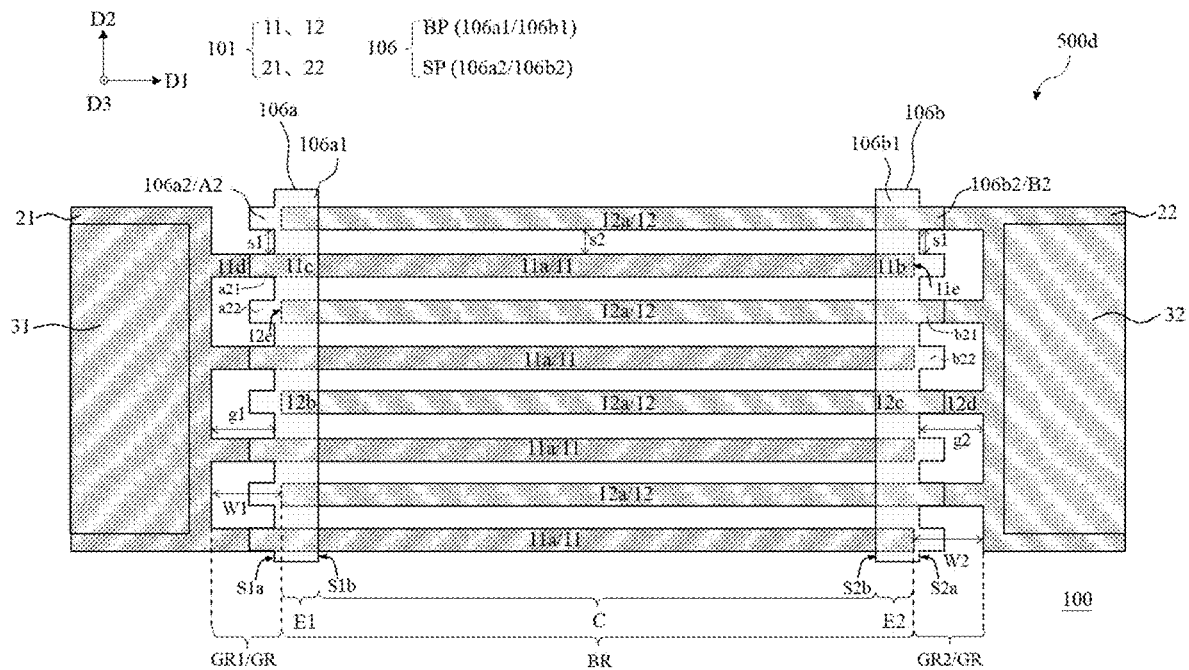
FIG. 5B illustrates a schematic enlarged top view of a partial region of the surface acoustic wave resonator device shown in FIG. 5A according to still some other embodiments of the present disclosure.

FIG. 5A illustrates a schematic top view of a surface acoustic wave resonator device according to still some other embodiments of the present disclosure, and FIG. 5B illustrates a schematic enlarged top view of a region D of FIG. 5A.

Referring to FIG. 5A and FIG. 5B, in some embodiments, in the first clutter suppression substructure 106a, the boundary between the first body part 106a1 and the first sawtooth part 106a2 (or the first body sidewall S1a) may be offset in the first direction D1 towards the first peripheral region GR1 with respect to the second electrode edge 12e; that is, in the first direction D1, the distance g1 between the first body sidewall S1a and the first interdigital electrode lead-out part 21 is smaller than the distance between the second electrode edge 12e and the first interdigital electrode lead-out part 21 (i.e., the first peripheral width W1). In the second clutter suppression substructure 106b, the boundary (or the second body sidewall S2a) between the second body part 106b1 and the second sawtooth part 106b2 may be offset in the first direction D1 towards the second peripheral region GR2 with respect to the first electrode edge 11e; that is, in the first direction D1, the distance g2 between the second body sidewall S2a and the second interdigital electrode lead-out part 22 is smaller than the distance between the first electrode edge 11e and the second interdigital electrode lead-out part 22 (i.e., the second peripheral width W2).

In this embodiment, the body part of each clutter suppression substructure extends beyond the corresponding electrode edge in the first direction, and overlaps with the end portions of a plurality of interdigital electrodes and portions of the connecting parts of the corresponding interdigital electrodes in the third direction; and each sawtooth part is located in the peripheral region. In the third direction, the end portions of a plurality of interdigital electrodes overlap with the body structure of the clutter suppression structure, and the connecting parts of the plurality of interdigital electrodes may overlap with the body structure and the sawtooth structure of the clutter suppression structure.

For example, the first body part 106a1 extends beyond the second electrode edge 12e in the first direction D1, and the end portions of the plurality of interdigital electrodes located in the first end region E1 overlap with a portion of the first body part 106a1 in the third direction; portions of the connecting parts 11d of the plurality of first interdigital electrodes 11 overlap with the first sawtooth part 106a2 and overlap with a portion the first body part 106a1 in the third direction D3.

For example, the second body part 106b1 extends beyond the first electrode edge 11e in the first direction D1, and the end portions of the plurality of interdigital electrodes located in the second end region E2 overlap with a portion of the second body part 106b1 in the third direction; portions of the connecting parts 12d of the plurality of second interdigital electrodes 12 overlap with the second sawtooth part 106b2, and overlap with a portion of the second body part 106b1 in the third direction D3. In this example, the orthographic projection of the first additional sub-extension part a22 on the piezoelectric substrate is offset from the orthographic projection of the second interdigital electrode 12 on the piezoelectric substrate, and the orthographic projection of the second additional sub-extension part b22 on the piezoelectric substrate is offset from the orthographic projection of the first interdigital electrode 11 on the piezoelectric substrate. In an alternative embodiment, the additional sub-extension parts (i.e., the first additional sub-extension part a22 and the second additional sub-extension part b22) of the respective sawtooth parts in this example may also be removed.

Figure 6A:
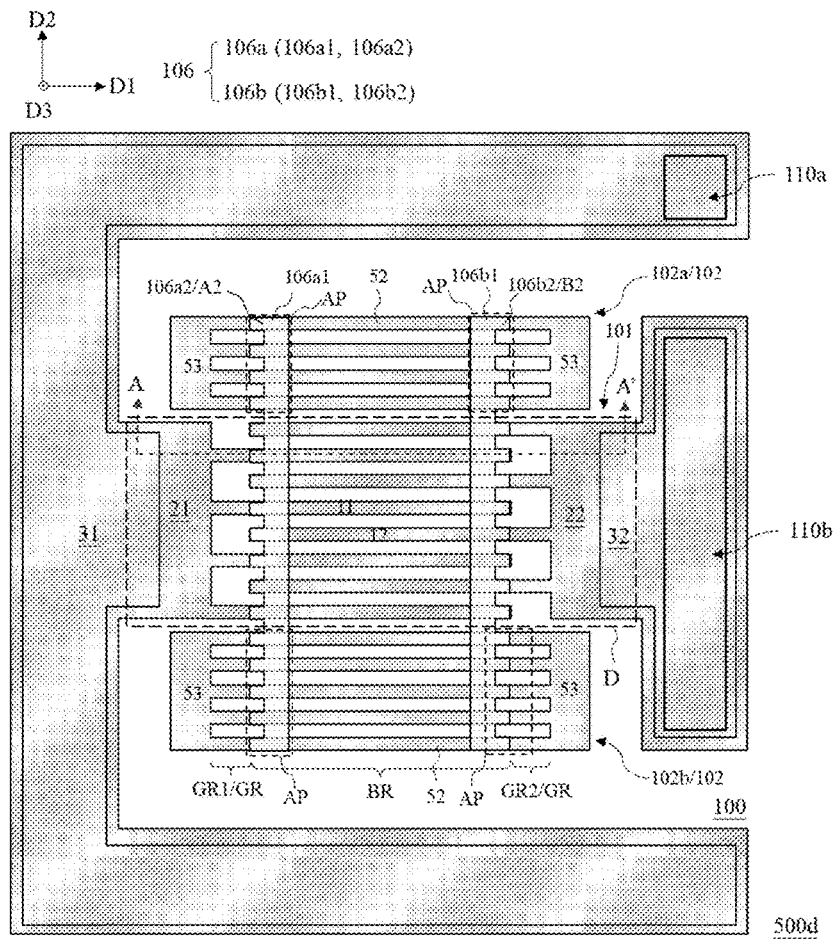
FIG. 6A illustrates a schematic top view of a surface acoustic wave resonator device according to some further embodiments of the present disclosure.
Figure 6B:
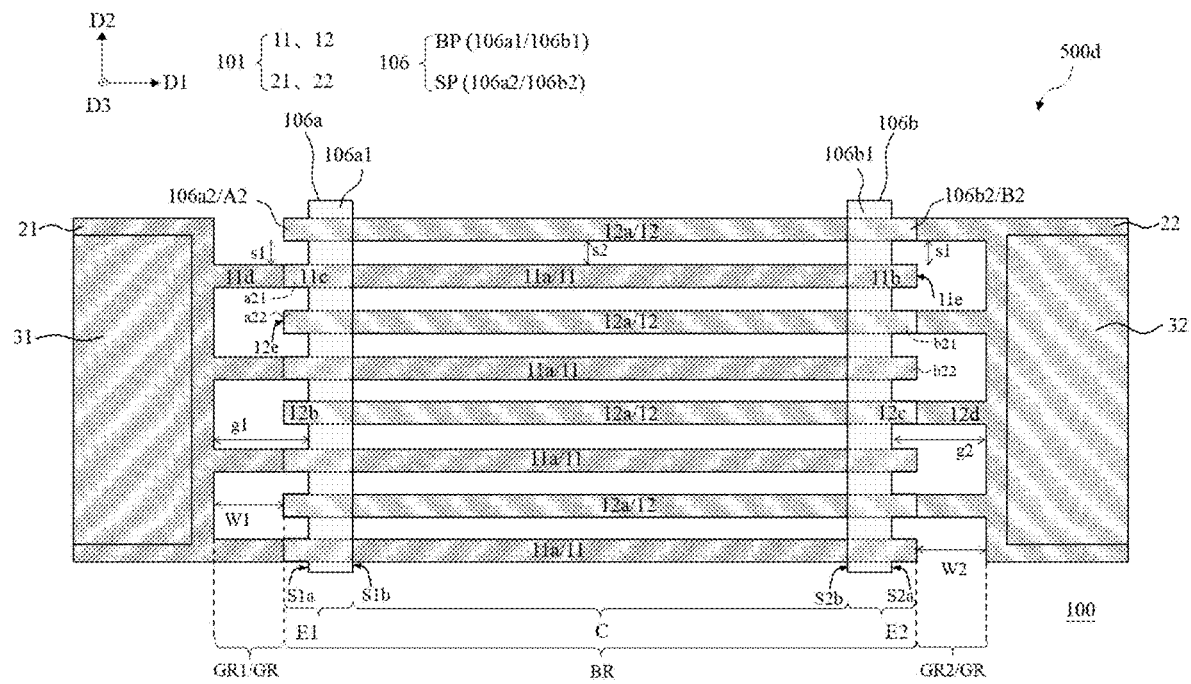
FIG. 6B illustrates a schematic enlarged top view of a partial region of the surface acoustic wave resonator device shown in FIG. 6A according to some further embodiments of the present disclosure.

FIG. 6A illustrates a schematic top view of a surface acoustic wave resonator device according to some further embodiments of the present disclosure, and FIG. 6B illustrates a schematic enlarged top view of a region D of FIG. 6A.

Referring to FIG. 6A and FIG. 6B, in some embodiments, both the body structure and the sawtooth structure of the clutter suppression structure may be located in the end regions without extending into the peripheral regions. The end portions of the first interdigital electrodes and the second interdigital electrodes overlap with the body structure and the sawtooth structure of the clutter suppression structure in the third direction D3. Each extension part of the sawtooth structure may overlap with the corresponding interdigital electrode or reflective electrode in the third direction, and the orthographic projection of each extension part on the piezoelectric substrate may be located within a range of the orthographic projection of the corresponding interdigital electrode or reflective electrode on the piezoelectric substrate. The sawtooth structure may have a sidewall aligned with the first electrode edge or the second electrode edge in a third direction. In each of the clutter suppression substructures, the body part overlaps, in the third direction, with parts of the end portions of the plurality of interdigital electrodes close to the central region C, and the sawtooth part overlaps, in the third direction, with parts of the end portions of the plurality of interdigital electrodes close to the peripheral region.

For example, in the first clutter suppression substructure, both the first body part 106a1 and the first sawtooth part 106a2 are located in the first end region E1; and the second end part 11c of each first interdigital electrode 11 and the first end part 12b of each second interdigital electrode 12 may each have a portion overlapping with the first body part 106a1 and a portion overlapping with the first sawtooth part 106a2. The first sawtooth part 106a2 may have a sidewall (for example, a sidewall of the first additional sub-extension part a22) aligned with the second electrode edge 12e in the third direction D3. In this example, the orthographic projection of the first sub-extension part a21 on the piezoelectric substrate is located within a range of the orthographic projection of the first interdigital electrode 11 on the piezoelectric substrate, and the orthographic projection of the first additional sub-extension part a22 on the piezoelectric substrate is located within a range of the orthographic projection of the second interdigital electrode 12 on the piezoelectric substrate.

For example, in the second clutter suppression substructure, both the second body part 106b1 and the second sawtooth part 106b2 are located in the second end region E2; and the first end part 11b of each first interdigital electrode 11 and the second end part 12c of each second interdigital electrode 12 may each have a portion overlapping with the second body part 106b1 and a portion overlapping with the second sawtooth part 106b2. The second sawtooth part 106b2 may have a sidewall (for example, a sidewall of the second additional sub-extension part b22) aligned with the first electrode edge 11e in the third direction D3. In this example, the orthographic projection of the second sub-extension part b21 on the piezoelectric substrate is located within a range of the orthographic projection of the second interdigital electrode 12 on the piezoelectric substrate; and the orthographic projection of the second additional sub-extension part b22 on the piezoelectric substrate is located within a range of the orthographic projection of the first interdigital electrode 11 on the piezoelectric substrate. In this embodiment, the connecting part 11d of the first interdigital electrode 11 and the connecting part 12d of the second interdigital electrode 12 do not overlap with the clutter suppression structure in the third direction D3; that is, the orthographic projections of the connecting part 11d of the first interdigital electrode 11 and the connecting part 12d of the second interdigital electrode 12 on the piezoelectric substrate 100 are offset from the orthographic projection of the clutter suppression structure 106 on the piezoelectric substrate 100.

The embodiments shown in FIG. 4A to FIG. 6A illustrate, based on the surface acoustic wave resonator 500a, various examples in which the clutter suppression structure is offset in the first direction. It should be understood that similar changes can also be made based on the surface acoustic wave resonator 500b so that the clutter suppression structure is offset in the first direction, thereby obtaining other alternative embodiments. In addition, in alternative embodiments such as FIG. 4A to FIG. 6A, after the clutter suppression structure is offset in the first direction, the widths of the body part and the sawtooth part of each clutter suppression substructure in the first direction D1 can be appropriately adjusted according to product designs and requirements, so as to meet the product requirements and ensure the clutter suppression capability of the clutter suppression structure.

In the various embodiments described above, the first clutter suppression substructure and the second clutter suppression substructure each have a first side and a second side opposite to each other in the first direction, wherein the first side is provided with the sawtooth structure and has an uneven surface, and the second side is away from the peripheral region and has a flat surface extending continuously in the second direction. Specifically, the flat surface of the second side of the first clutter suppression substructure may be the surface of the sidewall S1b of the first body part, and the flat surface of the second side of the second clutter suppression substructure may be the surface of the sidewall S2b of the second body part.

The embodiment of the present disclosure further provides a filter, which includes the surface acoustic wave resonator device described in any of the above embodiments, and the filter has the same technical effects described above with respect to the surface acoustic wave resonator.

An embodiment of the present disclosure provides a manufacturing method for a surface acoustic wave resonator device which has a body region and a peripheral region, and the peripheral region includes a first peripheral region and a second peripheral region located at two opposite sides of the body region in a first direction. Referring to FIG. 1A, FIG. 1B and FIG. 2A to FIG. 2C, in some embodiments, the manufacturing method includes: providing a piezoelectric substrate 100, forming an interdigital transducer 101 on a side of the piezoelectric substrate 100, and forming a clutter suppression structure 106 on a side of the interdigital transducer 101 away from the piezoelectric substrate 100.

The piezoelectric substrate 100 may include a suitable piezoelectric material such as piezoelectric crystal, piezoelectric ceramic or the like. For example, the material of the piezoelectric substrate 100 may include aluminum nitride (AlN), doped aluminum nitride, zinc oxide (ZnO), lead zirconate titanate (PZT), lithium niobate (LiNbO$_3$), quartz, potassium niobate (KNbO$_3$), lithium tantalate (LiTaO$_3$), the like or combinations thereof. In some embodiments, the piezoelectric substrate 100 may be a single-layered structure or a multi-layered structure, for example, may be a composite structure of piezoelectric thin films, such as a composite structure of a lithium tantalate piezoelectric thin film/silicon dioxide/a silicon substrate. In some embodiments, the piezoelectric substrate 100 may be a monocrystal piezoelectric substrate. However, the present disclosure is not limited thereto.

In some embodiments, the interdigital transducer may include a metal material, for example, may include one or more metal materials such as Ti, Cr, Ag, Cu, Mo, Pt, W, Al, etc. The interdigital transducer may be formed by a deposition process such as evaporation and a patterning process. For example, forming the interdigital transducer includes: depositing and forming an electrode material layer on the piezoelectric substrate, and performing a patterning process on the electrode material layer. The electrode material layer may be a single-layered structure or a multi-layered structure, for example, may be a combined lamination of two or more of the above metal materials. In some embodiments, a reflecting grating 102 is formed on the piezoelectric substrate 100; and the reflecting grating 102 and the interdigital transducer 101 may be formed from the electrode material layer by the same one patterning process. For specific structures of the interdigital transducer 101 and the reflecting grating 102, reference can be made to the above description without repeating here.

In some embodiments, the manufacturing method further includes: forming a dielectric layer 102 on the piezoelectric substrate 100 to cover the sidewalls of the interdigital transducer 101 and the reflecting grating 102 and the surfaces of the interdigital transducer 101 and the reflecting grating 102 at a side away from the piezoelectric substrate 100, before forming the clutter suppression structure 106. The dielectric layer 102 may include a dielectric material such as silicon oxide, and may be used as a temperature compensation layer. In some embodiments, the manufacturing method may further include: forming a protection layer (not shown) on the piezoelectric substrate 100 before forming the dielectric layer 102. The protection layer extends along the surfaces of the interdigital transducer and the reflecting grating; and the interdigital transducer and the reflecting grating are spaced apart from the subsequently formed dielectric layer 102 by the protection layer. The protection layer can protect the interdigital transducer and the reflecting grating from being oxidized, for example, during the process of forming the dielectric layer 102.

In some embodiments, after the dielectric layer 102 is formed, a clutter suppression structure 106 is formed on a side of the dielectric layer 102 away from the piezoelectric substrate 100. The clutter suppression structure 106 may include a metal structure, and may include a metal material such as gold, tungsten, silver, titanium, platinum, aluminum, copper, molybdenum, the like, alloys thereof or combinations thereof. The metal structure includes a first metal substructure used as a first clutter suppression substructure and a second metal substructure used as a second clutter suppression substructure. The metal structure may be fabricated by: forming a metal material layer on a side of the dielectric layer 102 away from the piezoelectric substrate 100 through a deposition process such as evaporation, and performing a patterning process on the metal material layer to form the metal structure including the first metal substructure and the second metal substructure.

In the embodiments of the present disclosure, each clutter suppression substructure of the clutter suppression structure 106 includes a body part and a sawtooth part, which are connected with each other and integrally formed; wherein the body part is disposed to continuously extend across a plurality of interdigital electrodes in the second direction, and the sawtooth part includes a plurality of extension parts arranged at intervals. In this way, on the one hand, the body part extends continuously and is connected to the sawtooth part so as to improve the stability of the clutter suppression structure formed in the manufacturing process; and on the other hand, disposing the sawtooth part can improve the clutter suppression capability of the clutter suppression structure, while relatively reducing the overall metal coverage area of the clutter suppression structure, thereby lowering the ohmic loss and improving the device performance.

In some embodiments, the manufacturing method further includes: forming a dielectric layer 108 on a side of the dielectric layer 102 away from the piezoelectric substrate after forming the clutter suppression structure 106; forming a first conductive connector 31 and a second conductive connector 32 to be respectively connected to the first interdigital electrode lead-out part and the second interdigital electrode lead-out part; and forming a passivation layer 110 and removing a part of the passivation layer 110 to form a first passivation opening and a second passivation opening.

Figure 7A:
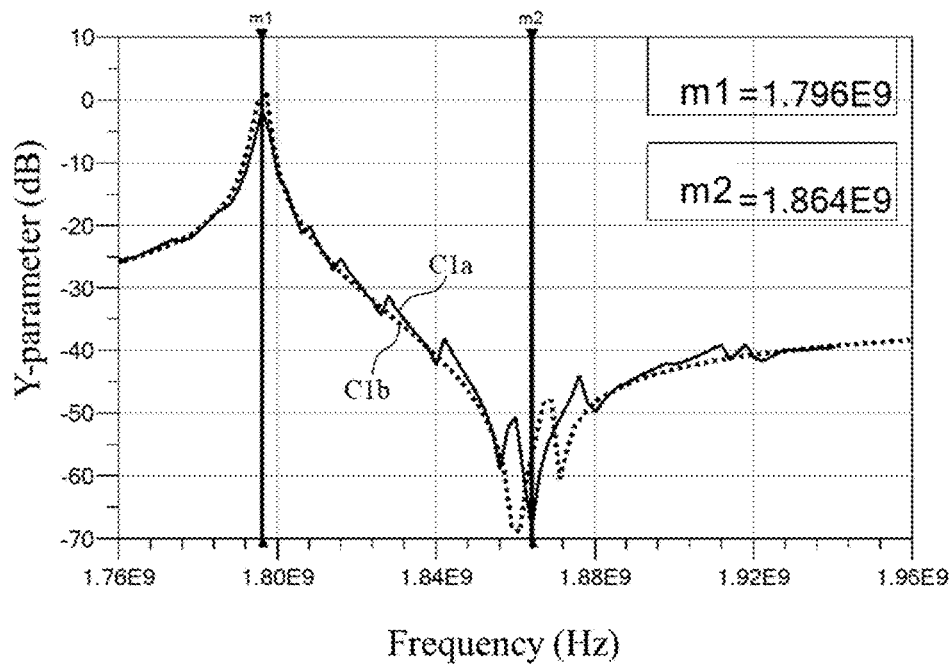
FIG. 7A illustrates admittance response diagrams of a conventional surface acoustic wave resonator device and a surface acoustic wave resonator device of an embodiment of the present disclosure.
Figure 7B:
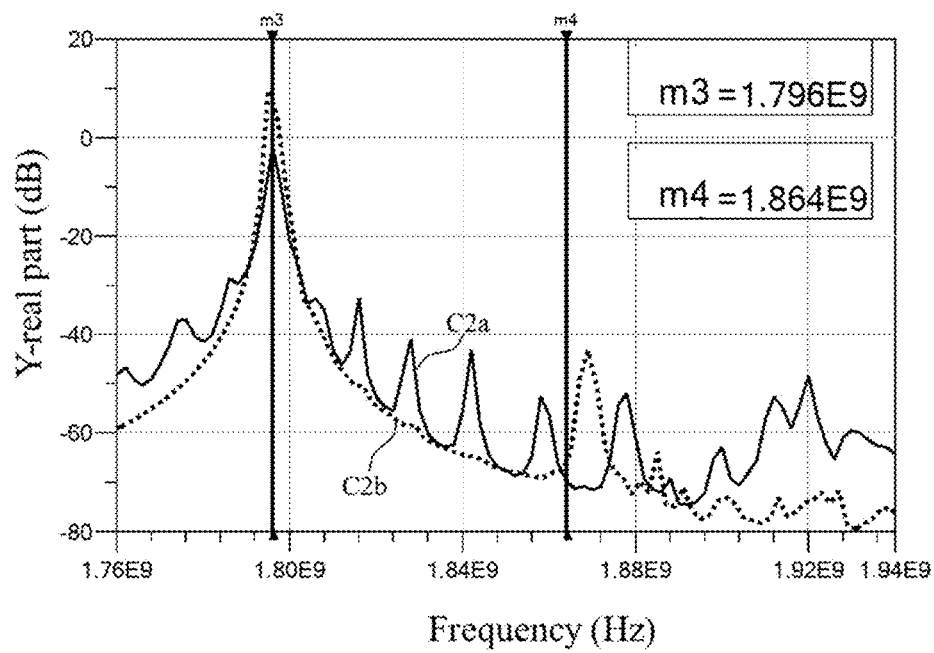
FIG. 7B illustrates real part response diagrams of a conventional surface acoustic wave resonator device and a surface acoustic wave resonator device of an embodiment of the present disclosure.

FIG. 7A illustrates admittance response diagrams of a conventional surface acoustic wave resonator device and a surface acoustic wave resonator device 500a with a clutter suppression structure including a body part and a sawtooth part according to an embodiment of the present disclosure, in which an admittance vs frequency response curve C1a (shown by a solid line) of the conventional surface acoustic wave resonator device and an admittance vs frequency response curve C1b (shown by a dotted line) of the surface acoustic wave resonator device 500a according to an embodiment of the present disclosure are shown. FIG. 7B illustrates real part response diagrams of a conventional surface acoustic wave resonator device and a surface acoustic wave resonator device 500a with a clutter suppression structure including a body part and a sawtooth part according to an embodiment of the present disclosure, in which a real part vs frequency response curve C2a (shown by a solid line) of the conventional surface acoustic wave resonator device and a real part vs frequency response curve C2b (shown by a dotted line) of the surface acoustic wave resonator device 500a according to an embodiment of the present disclosure are shown.

Referring to FIG. 7A and FIG. 7B, it should be understood that, more spurious peaks in the frequency response curve indicates more clutters in the resonator, and a smoother frequency response curve indicates less clutter in the resonator. Comparing the admittance vs frequency response curve C1a and the real part vs frequency response curve C2a of the traditional surface acoustic wave resonator device, with the admittance vs frequency response curve C1b and the real part vs frequency response curve C2b of the surface acoustic wave resonator device 500a of the embodiment of the present disclosure, it can be seen that: in a specific frequency range, for example, in some examples, in the frequency range of 1.796E9 to 1.864E9 Hz, both the admittance vs frequency response curve C1a and the real part vs frequency response curve C2a of the traditional resonator have multiple spurious peaks, that is, there are multiple clutters in spurious modes; while the admittance vs frequency response curve C1b and the real part vs frequency response curve C2b of the surface acoustic wave resonator structure 500a are both smooth and have no obvious spurious peaks, this is because the formation and/or propagation of clutter is suppressed by disposing the clutter suppression structure 106 of the embodiment of the present disclosure, and the clutter suppression capability of the clutter suppression structure 106 is improved by the above-mentioned structural configurations. In this way, the energy loss is avoided or reduced, and the performance of the resonator is improved.

Therefore, in the embodiments of the present disclosure, through disposing the clutter suppression structure including the body structure and the sawtooth structure, the capability of the resonator device to suppress clutter can be improved; furthermore, the structural stability of the clutter suppression structure can be increased and the ohmic loss can be reduced, so that the device performance is improved. In addition, the sawtooth structure is disposed at a side of the body structure close to the peripheral region, which can prevent the sawtooth structure from occupying the effective resonance area to a certain extent, which is beneficial to reducing the product size.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

What is claimed is:

1. A surface acoustic wave resonator device, having a body region and a peripheral region, wherein the peripheral region comprises a first peripheral region and a second peripheral region located at two opposite sides of the body region in a first direction, and the surface acoustic wave resonator device comprises:

a piezoelectric substrate;

an interdigital transducer, disposed on a side of the piezoelectric substrate and comprising a plurality of interdigital electrodes, a first interdigital electrode lead-out part and a second interdigital electrode lead-out part, wherein the plurality of interdigital electrodes comprise a first interdigital electrode and a second interdigital electrode; the first interdigital electrode and the second interdigital electrode extend along the first direction and are alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and a clutter suppression structure, disposed on a side of the interdigital transducer away from the piezoelectric substrate and comprising a body structure and a sawtooth structure, wherein the body structure continuously extends along the second direction and overlaps with end portions of the plurality of interdigital electrodes close to the peripheral region in a third direction perpendicular to a main surface of the piezoelectric substrate, and the sawtooth structure is disposed at a side of the body structure away from the body region in the first direction, and at least a portion of the sawtooth structure overlaps with the plurality of interdigital electrodes in the third direction.

2. The surface acoustic wave resonator device according to claim 1, wherein the first interdigital electrode has a first electrode edge that is away from the first interdigital electrode lead-out part in the first direction; the second interdigital electrode has a second electrode edge that is away from the second interdigital electrode lead-out part in the first direction; wherein the sawtooth structure extends beyond at least one of the first electrode edge and the second electrode edge in the first direction, and at least a portion of the sawtooth structure is located in the peripheral region; or the sawtooth structure has a sidewall aligned with the first electrode edge or the second electrode edge in the third direction.

3. The surface acoustic wave resonator device according to claim 1, wherein the clutter suppression structure comprises:

a first clutter suppression substructure, comprising a first body part and a first sawtooth part which are connected with each other, wherein the first body part overlaps with the end portions of the plurality of interdigital electrodes close to the first peripheral region in the third direction, and the first sawtooth part protrudes, in the first direction, from a first body sidewall of the first body part close to the first peripheral region; and a second clutter suppression substructure, comprising a second body part and a second sawtooth part which are connected with each other, wherein the second body part overlaps with the end portions of the plurality of interdigital electrodes close to the second peripheral region in the third direction, and the second sawtooth part protrudes, in the first direction, from a second body sidewall of the second body part close to the second peripheral region, wherein the first body part and the second body part constitute the body structure, and the first sawtooth part and the second sawtooth part constitute the sawtooth structure.

4. The surface acoustic wave resonator device according to claim 3, wherein at least a portion of the first sawtooth part overlaps with the first interdigital electrode in the third direction; and at least a portion of the second sawtooth part overlaps with the second interdigital electrode in the third direction.

5. The surface acoustic wave resonator device according to claim 4, wherein the sawtooth structure further comprises at least one of following features:

the first sawtooth part further comprises a portion overlapping with the second interdigital electrode in the third direction; and the second sawtooth part further comprises a portion overlapping with the first interdigital electrode in the third direction.

6. The surface acoustic wave resonator device according to claim 3, wherein the first sawtooth part comprises a plurality of first extension parts extending along the first direction and arranged at intervals along the second direction; and the second sawtooth part comprises a plurality of second extension parts extending along the first direction and arranged at intervals along the second direction.

7. The surface acoustic wave resonator device according to claim 6, wherein a spacing between adjacent first extension parts among the plurality of first extension parts in the second direction or a spacing between adjacent second extension parts among the plurality of second extension parts in the second direction is greater than or equal to a spacing between adjacent interdigital electrodes among the plurality of interdigital electrodes in the second direction.

8. The surface acoustic wave resonator device according to claim 6, wherein the plurality of first extension parts at least comprise a first sub-extension part, wherein the first sub-extension part and the first interdigital electrode are disposed in one-to-one correspondence with each other and overlap with each other in the third direction;

the plurality of second extension parts at least comprise a second sub-extension part, wherein the second sub-extension part and the second interdigital electrode are disposed in one-to-one correspondence with each other and overlap with each other in the third direction.

9. The surface acoustic wave resonator device according to claim 8, wherein an orthographic projection of the first sub-extension part on the piezoelectric substrate is located within a range of an orthographic projection of the first interdigital electrode on the piezoelectric substrate; and an orthographic projection of the second sub-extension part on the piezoelectric substrate is located within a range of an orthographic projection of the second interdigital electrode on the piezoelectric substrate.

10. The surface acoustic wave resonator device according to claim 8, wherein the plurality of first extension parts further comprise a first additional sub-extension part, and an orthographic projection of the first additional sub-extension part on the piezoelectric substrate is at least partially aligned, in the first direction, with an orthographic projection of the second interdigital electrode on the piezoelectric substrate; and the plurality of second extension parts further comprise a second additional sub-extension part, and an orthographic projection of the second additional sub-extension part on the piezoelectric substrate is at least partially aligned, in the first direction, with an orthographic projection of the first interdigital electrode on the piezoelectric substrate.

11. The surface acoustic wave resonator device according to claim 3, wherein an orthographic projection of the first body sidewall on the piezoelectric substrate and an orthographic projection of the second electrode edge of the second interdigital electrode away from the second interdigital electrode lead-out part on the piezoelectric substrate are aligned with each other in the second direction, or the first body sidewall is offset in the first direction, towards or away from the first peripheral region, with relative to the second electrode edge; and an orthographic projection of the second body sidewall on the piezoelectric substrate and an orthographic projection of the first electrode edge of the first interdigital electrode away from the first interdigital electrode lead-out part on the piezoelectric substrate are aligned with each other in the second direction, or the second body sidewall is offset in the first direction, towards or away from the second peripheral region, with relative to the first electrode edge; or a portion of the first body sidewall is aligned, in the third direction, with a second electrode edge of the second interdigital electrode away from the second interdigital electrode lead-out part; a portion of the second body sidewall is aligned, in the third direction, with the first electrode edge of the first interdigital electrode away from the first interdigital electrode lead-out part.

12. The surface acoustic wave resonator device according to claim 3, wherein the first clutter suppression substructure and the second clutter suppression substructure each have a first side and a second side opposite to each other in the first direction, wherein the first side is provided with the sawtooth structure and has an uneven surface, and the second side is away from the peripheral region and has a flat surface extending continuously in the second direction.

13. The surface acoustic wave resonator device according to claim 3, wherein the first interdigital electrode and the second interdigital electrode each comprise a central part, a first end part, a second end part and a connecting part; in each interdigital electrode, the first end part and the second end part are located at two opposite sides of the central part in the first direction, and the connecting part is located at a side of the second end part away from the central part and is connected to a corresponding one of the first interdigital electrode lead-out part and the second interdigital electrode lead-out part; the connecting part of the first interdigital electrode is located in the first peripheral region, and the connecting part of the second interdigital electrode is located in the second peripheral region; and orthographic projections of the first end part and the second end part of the first interdigital electrode and the first end part and the second end part of the second interdigital electrode on the piezoelectric substrate are located within a range of an orthographic projection of the clutter suppression structure on the piezoelectric substrate.

14. The surface acoustic wave resonator device according to claim 13, wherein orthographic projections of a portion of the connecting part of the first interdigital electrode and a portion of the connecting part of the second interdigital electrode on the piezoelectric substrate are also located within the range of the orthographic projection of the clutter suppression structure on the piezoelectric substrate.

15. The surface acoustic wave resonator device according to claim 13, wherein orthographic projections of the second end part of the first interdigital electrode and the first end part of the second interdigital electrode on the piezoelectric substrate are located within an orthographic projection of the first body part on the piezoelectric substrate, and a portion of the connecting part of the first interdigital electrode overlaps with the first sawtooth part in the third direction; and orthographic projections of the first end part of the first interdigital electrode and the second end part of the second interdigital electrode on the piezoelectric substrate are located within an orthographic projection of the second body part on the piezoelectric substrate, and a portion of the connecting part of the second interdigital electrode overlaps with the second sawtooth part in the third direction; or in the third direction, the second end part of the first interdigital electrode and the first end part of the second interdigital electrode overlap with the first body part and overlap with the first sawtooth part; or the first end part of the first interdigital electrode and the second end part of the second interdigital electrode overlap with the second body part and overlap with the second sawtooth part; or in the third direction, a portion of the connecting part of the first interdigital electrode overlaps with the first sawtooth part and overlaps with the first body part; or a portion of the connecting part of the second interdigital electrode overlaps with the second sawtooth part and overlaps with the second body part; or the end portions of the first interdigital electrode and the second interdigital electrode overlap with the body structure and the sawtooth structure of the clutter suppression structure in the third direction; and orthographic projections of the connecting part of the first interdigital electrode and the connecting part of the second interdigital electrode on the piezoelectric substrate are offset from an orthographic projection of the clutter suppression structure on the piezoelectric substrate.

16. The surface acoustic wave resonator device according to claim 3, further comprising:

reflecting gratings, disposed on two opposite sides of the interdigital transducer in the second direction, wherein each reflecting grating comprises a plurality of reflective electrodes and a busbar; the plurality of reflective electrodes extend along the first direction and are arranged at intervals along the second direction; and the busbar extends along the second direction and is connected to the plurality of reflective electrodes, wherein the clutter suppression structure further partially overlaps with the reflecting gratings in the third direction perpendicular to the main surface of the piezoelectric substrate.

17. The surface acoustic wave resonator device according to claim 16, wherein the first clutter suppression substructure and the second clutter suppression substructure each have an additional region overlapping with the reflecting gratings; and in the additional region, each extension part comprised in the first sawtooth part or the second sawtooth part overlaps with a corresponding one of the plurality of reflective electrodes in the third direction.

18. The surface acoustic wave resonator device according to claim 1, further comprising:

a temperature compensation layer, disposed on the piezoelectric substrate and covering the interdigital transducer, wherein the clutter suppression structure is located on a side of the temperature compensation layer away from the piezoelectric substrate, wherein the clutter suppression structure comprises a metal structure, and the metal structure is electrically floating.

19. A filter, comprising the surface acoustic wave resonator device according to claim 1.

20. A manufacturing method for a surface acoustic wave resonator device, wherein the surface acoustic wave resonator device has a body region and a peripheral region, the peripheral region comprises a first peripheral region and a second peripheral region located at two opposite sides of the body region in a first direction, the manufacturing method comprises:

providing a piezoelectric substrate;

forming an interdigital transducer on a side of the piezoelectric substrate, wherein the interdigital transducer comprises a plurality of interdigital electrodes, a first interdigital electrode lead-out part and a second interdigital electrode lead-out part, and the plurality of interdigital electrodes comprise a first interdigital electrode and a second interdigital electrode; the first interdigital electrode and the second interdigital electrode extend along the first direction and are alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and forming a clutter suppression structure on a side of the interdigital transducer away from the piezoelectric substrate, wherein the clutter suppression structure comprises a body structure and a sawtooth structure, wherein the body structure continuously extends along the second direction and overlaps with end portions of the plurality of interdigital electrodes close to the peripheral region in a third direction perpendicular to a main surface of the piezoelectric substrate; the sawtooth structure is disposed on a side of the body structure away from the body region in the first direction, and at least a portion of the sawtooth structure overlaps with the plurality of interdigital electrodes in the third direction.

* * * * *